(12) United States Patent
Yoo et al.

(10) Patent No.: US 10,987,893 B2
(45) Date of Patent: Apr. 27, 2021

(54) THERMALLY CONDUCTIVE THIN FILM SHEET AND ARTICLE COMPRISING SAME

(71) Applicant: INDONG ADVANCED MATERIALS, INC., Osan-si (KR)

(72) Inventors: Sung-Woon Yoo, Seoul (KR); Dong-Ha Kim, Seoul (KR)

(73) Assignee: INDONG ADVANCED MATERIALS, INC., Osan-si (KR)

( * ) Notice: Subject to any disclaimer, the term of this patent is extended or adjusted under 35 U.S.C. 154(b) by 180 days.

(21) Appl. No.: 16/309,592

(22) PCT Filed: Jun. 14, 2017

(86) PCT No.: PCT/KR2017/006189
§ 371 (c)(1),
(2) Date: Dec. 13, 2018

(87) PCT Pub. No.: WO2017/217759
PCT Pub. Date: Dec. 21, 2017

(65) Prior Publication Data
US 2019/0210322 A1     Jul. 11, 2019

(30) Foreign Application Priority Data

Jun. 17, 2016 (KR) ........................ 10-2016-0075643

(51) Int. Cl.
*B32B 5/16* (2006.01)
*B32B 5/30* (2006.01)
(Continued)

(52) U.S. Cl.
CPC .................. *B32B 5/16* (2013.01); *B32B 5/30* (2013.01); *B32B 7/12* (2013.01); *H01L 23/373* (2013.01);
(Continued)

(58) Field of Classification Search
CPC .... B32B 5/16; B32B 5/30; B32B 7/12; B32B 5/00; H05K 7/20; H05K 7/20472;
(Continued)

(56) References Cited

U.S. PATENT DOCUMENTS 5,958,590 A    9/1999   Kang et al.
8,999,200 B2 *   4/2015   Bandyopadhyay .... C08K 3/041
                                                                               252/500
(Continued)

FOREIGN PATENT DOCUMENTS

JP         5867047 B2    2/2016
KR    2011-0085222 A   7/2011
(Continued)

OTHER PUBLICATIONS

Kim (KR 10-1722069 B1); Mar. 2017 (KIPRIS—machine translation to English). (Year: 2017).*
(Continued)

Primary Examiner — Frank J Vineis
Assistant Examiner — Donald M Flores, Jr.
(74) Attorney, Agent, or Firm — Sughrue Mion, PLLC

(57) ABSTRACT

The present invention relates to a thermally conductive thin sheet for protecting an element, etc. integrated in an electronic device from heat, and an article comprising the same. As the thermally conductive thin film sheet has a thermally conductive filler layer formed on both surfaces of a thermally conductive adhesive film having a composite filler, the thermally conductive thin film sheet has excellent tensile strength and flexibility and thus is easy to handle while having a high fill factor of the thermally conductive filler. Accordingly, heat generated during use can be effectively removed by applying the thermally conductive thin film sheet to various articles such as electronic devices, illumination equipment, etc., in which a light emitting source such (Continued)

as an LED, an OLED, etc. is adopted or IC chips are highly integrated.

15 Claims, 17 Drawing Sheets

(51) Int. Cl.
    *B32B 7/12* (2006.01)
    *H01L 23/373* (2006.01)
    *H05K 7/20* (2006.01)

(52) U.S. Cl.
    CPC ...... *H01L 23/3731* (2013.01); *H01L 23/3735* (2013.01); *H01L 23/3736* (2013.01); *H01L 23/3737* (2013.01); *H05K 7/20* (2013.01); *Y10T 428/249921* (2015.04); *Y10T 428/25* (2015.01)

(58) Field of Classification Search
    CPC .............. H05K 7/20481; H01L 23/373; H01L 23/3731; H01L 23/3735; H01L 23/3736; H01L 23/3737; Y10T 428/25; Y10T 428/249921; C08J 2433/06; C08J 7/0423; C08J 2367/02; C08J 7/06; C08J 7/0427; C09J 7/20; C09J 11/04; C08K 3/04; C08K 7/08; C08K 2201/001

See application file for complete search history.

(56) References Cited

U.S. PATENT DOCUMENTS

2011/0193010 A1    8/2011  Keite-Telgenbuscher et al.
2015/0313041 A1*  10/2015  Wu ...................... H01L 23/373
                                           165/133

FOREIGN PATENT DOCUMENTS

| KR | 10-1442070 B1 | 9/2014 | |
|---|---|---|---|
| KR | 1509494 B1 | 4/2015 | |
| KR | 2015-0120765 A | 10/2015 | |
| KR | 10-1722069 B1 | 3/2017 | |
| KR | 101722069 B1 * | 3/2017 | ........... H01L 23/373 |
| WO | 2010/037676 A1 | 4/2010 | |
| WO | 2013/191410 A1 | 12/2013 | |
| WO | 2014-129077 A1 | 8/2014 | |
| WO | 2015/183896 A1 | 12/2015 | |

OTHER PUBLICATIONS

International Search Report PCT/KR2017/006189 dated Sep. 20, 2017.

* cited by examiner

[Fig. 1]
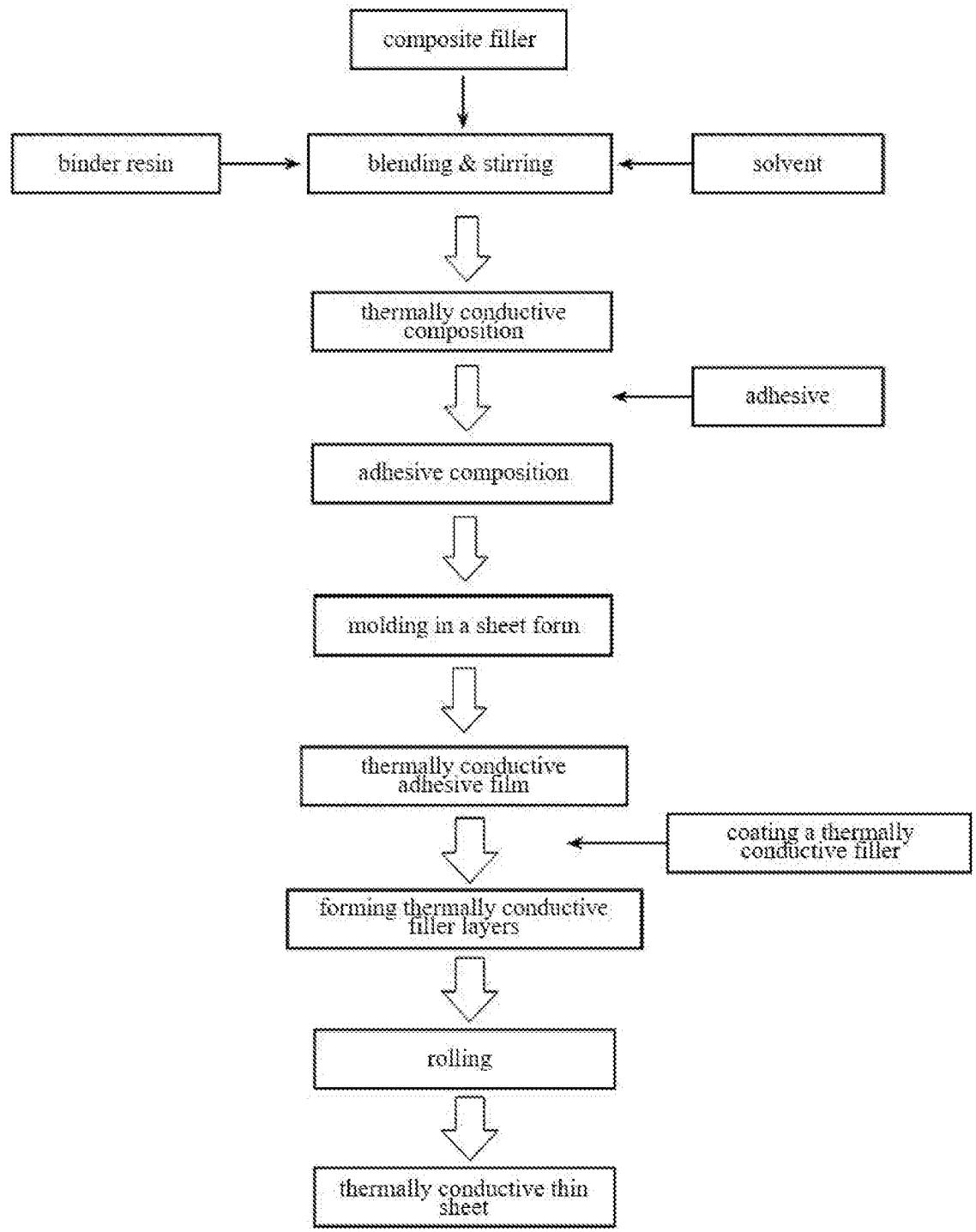

[Fig. 2a]
[Fig. 2b]
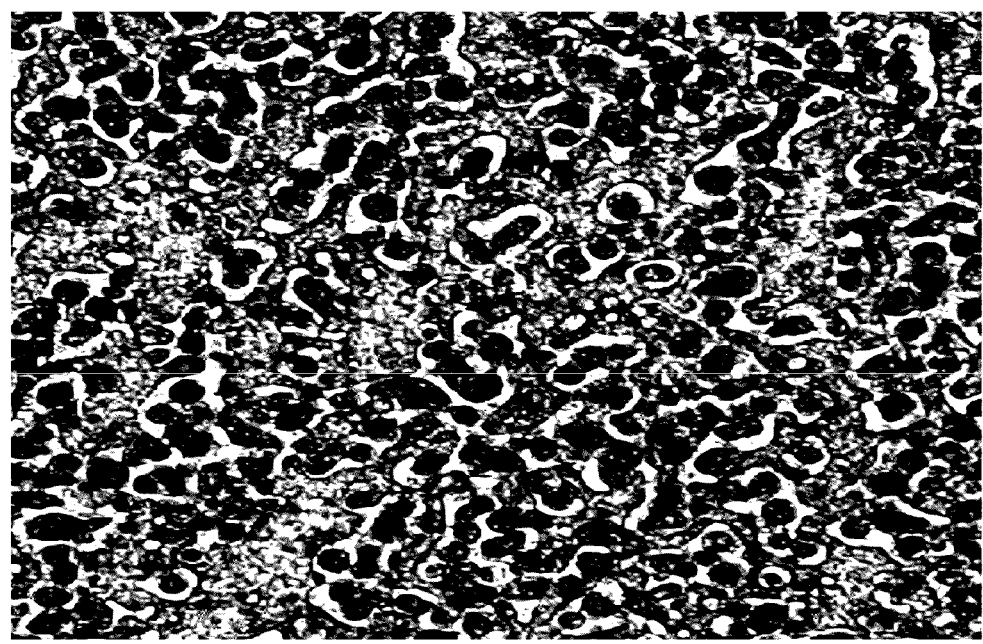

[Fig. 3a]
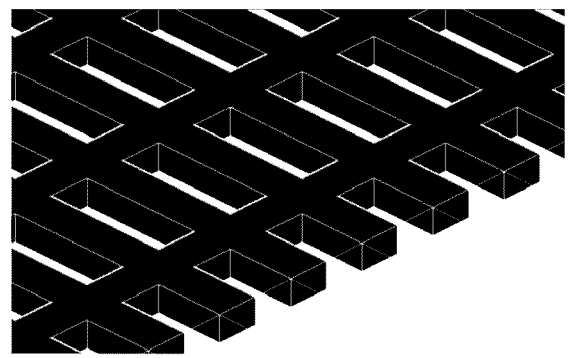
[Fig. 3b]
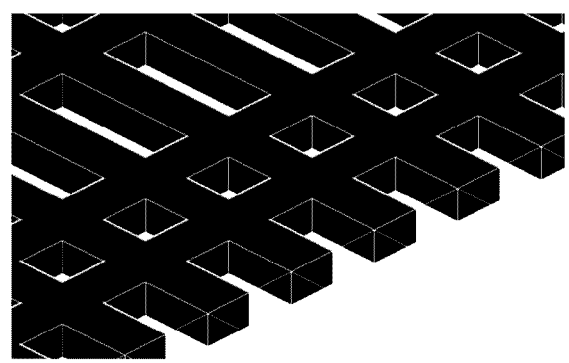
[Fig. 3c]
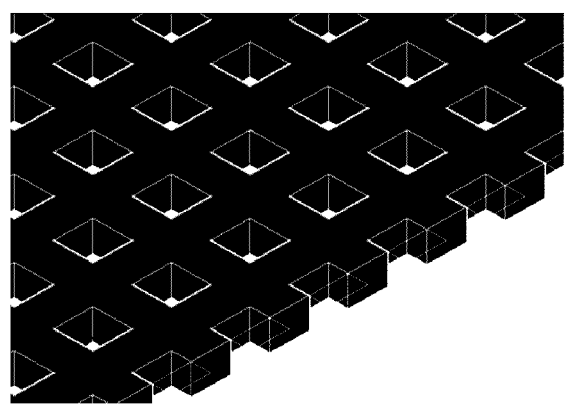

[Fig. 4a]
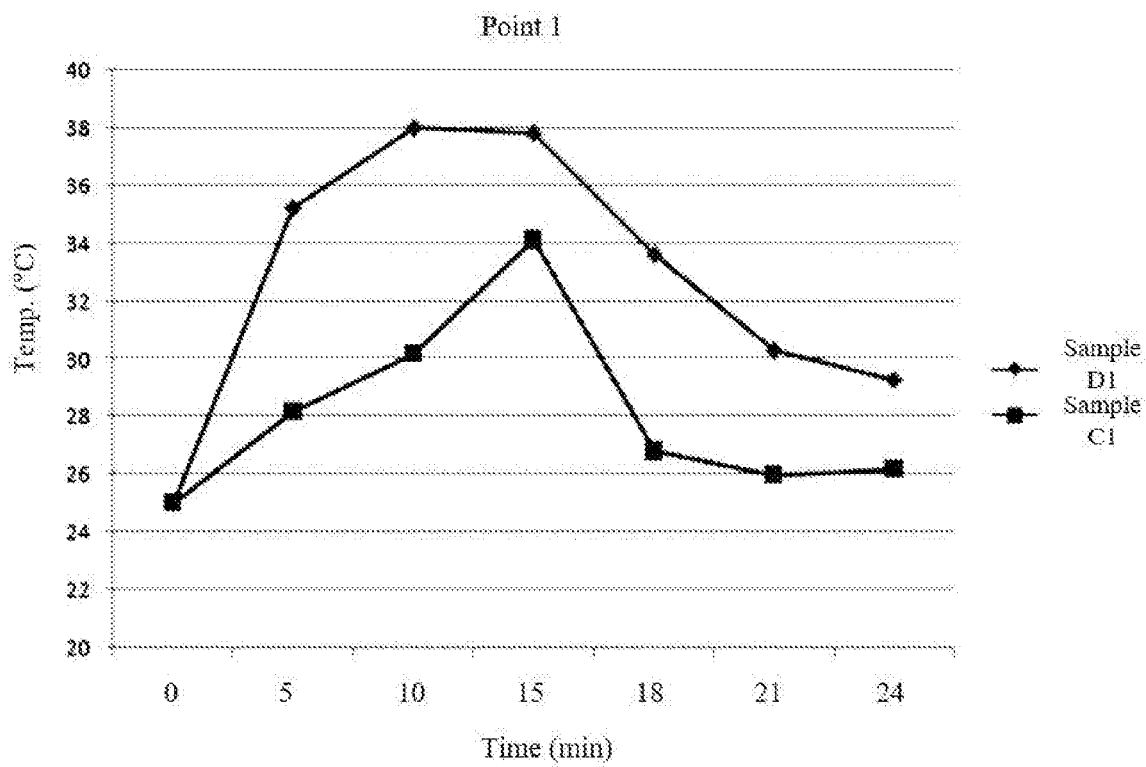
[Fig. 4b]
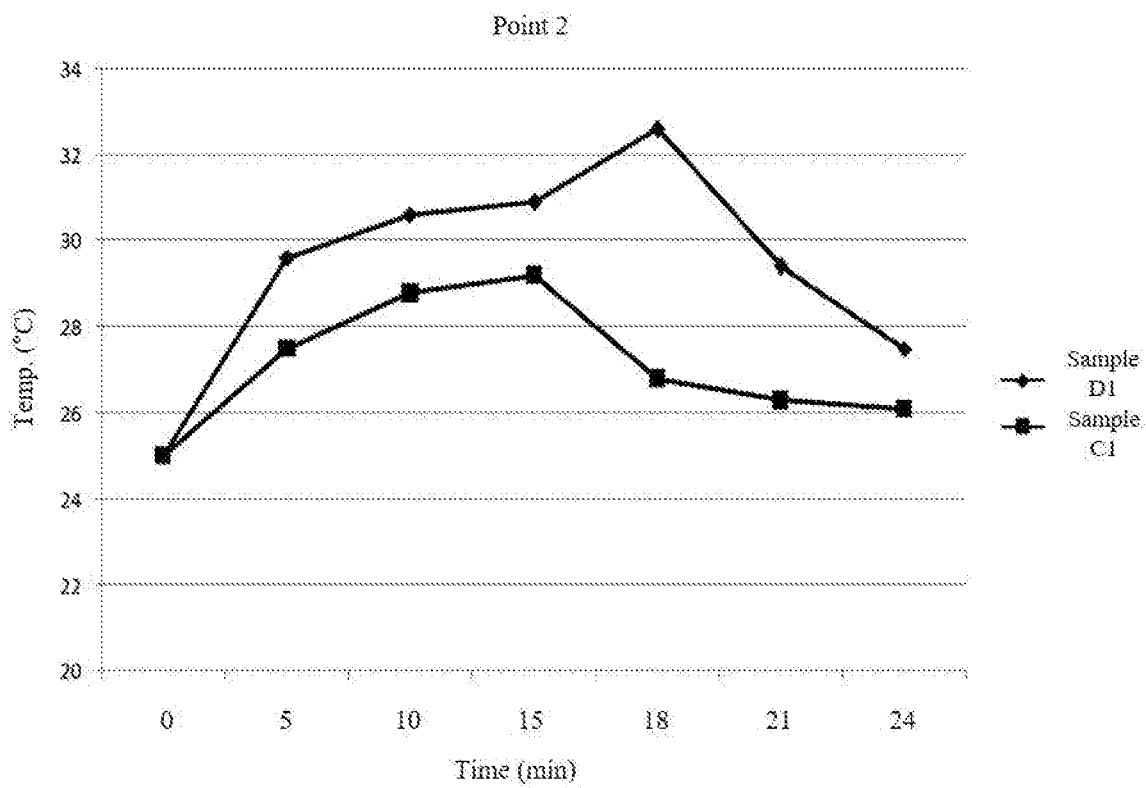

[Fig. 5a]
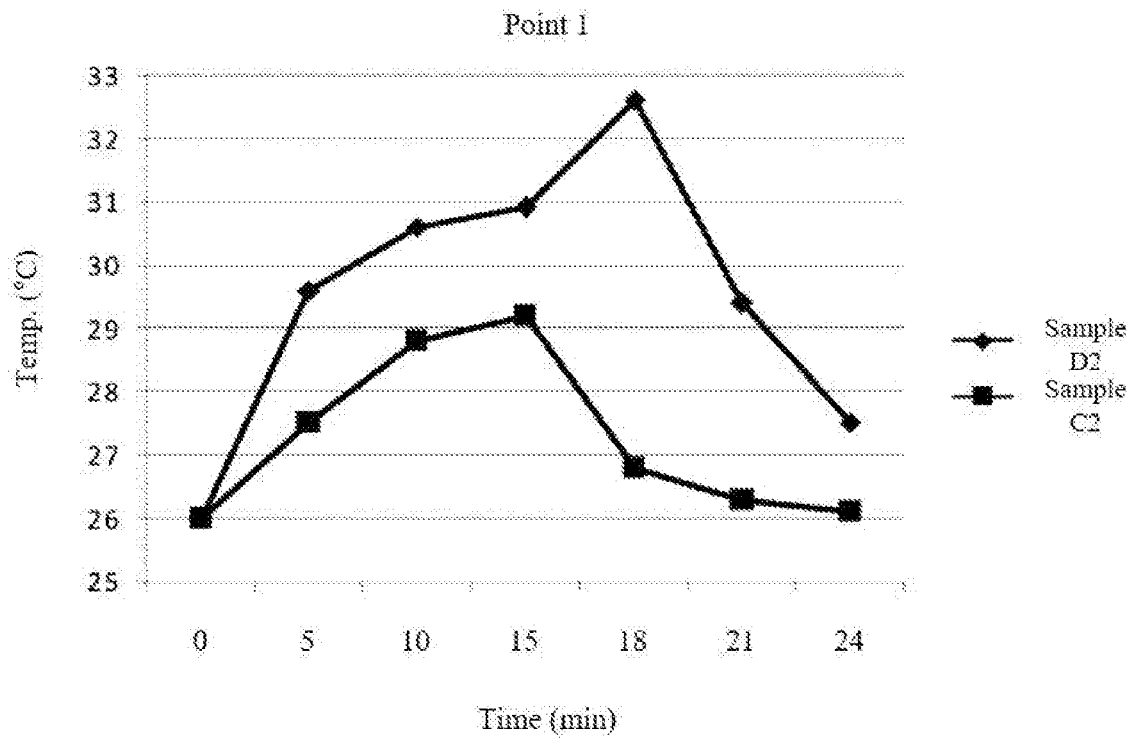
[Fig. 5b]
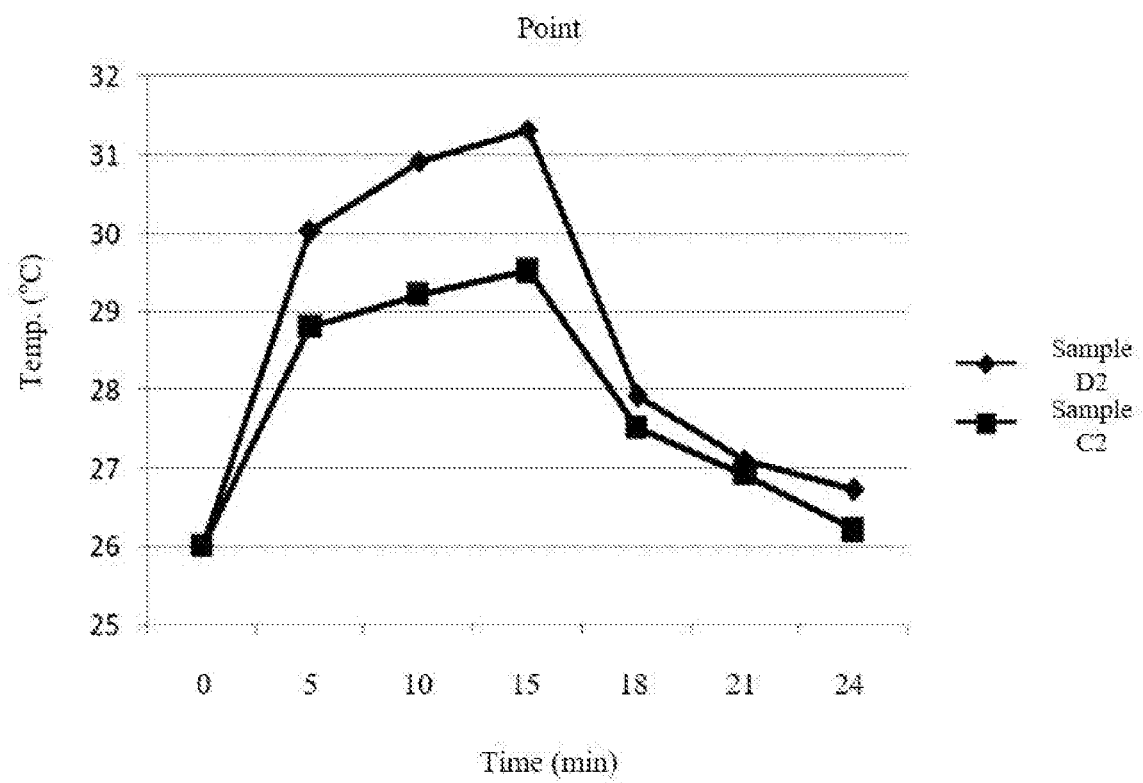

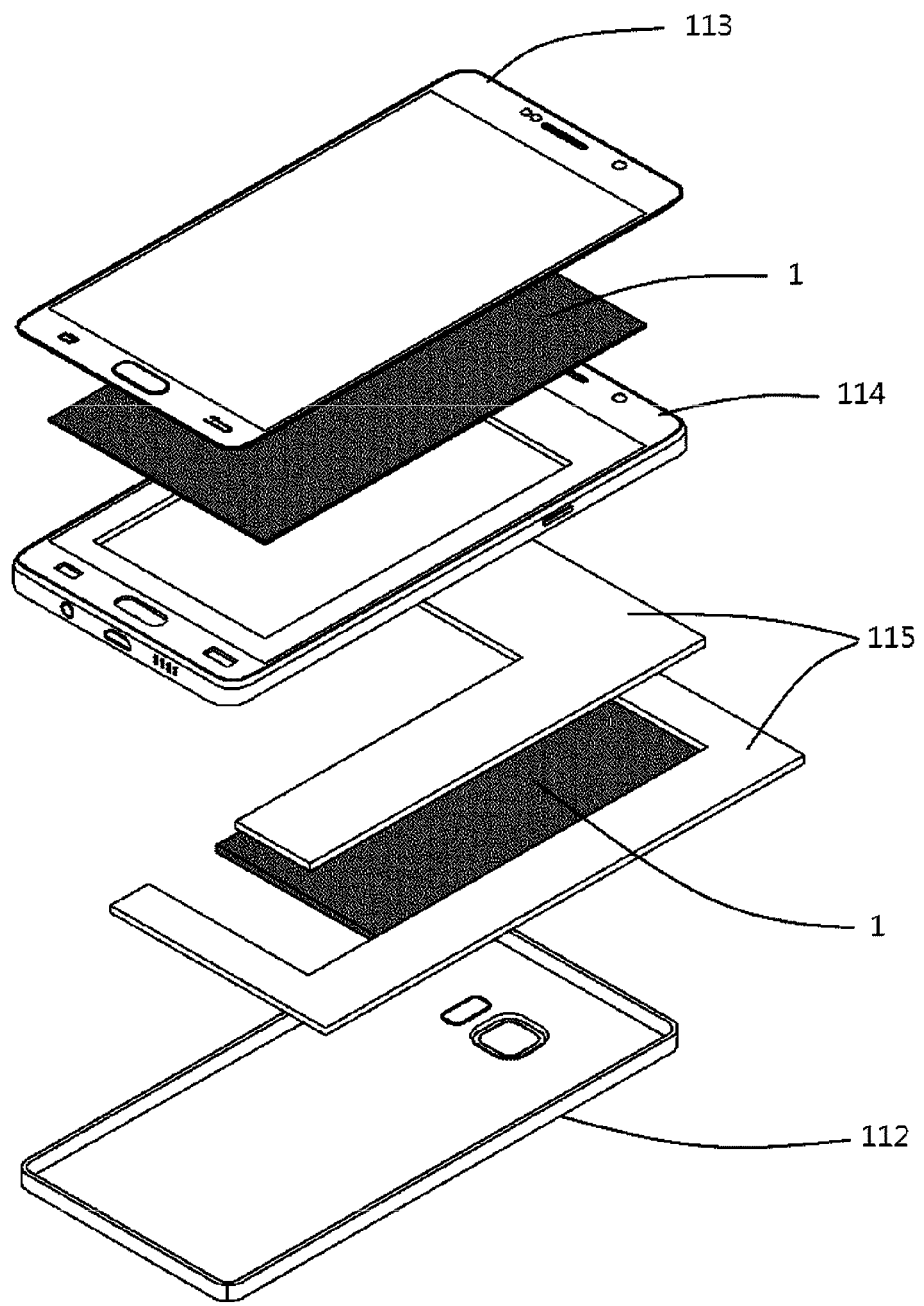
[Fig. 6]

[Fig. 7a]
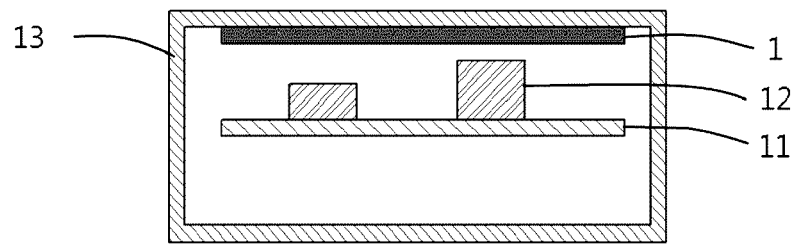
[Fig. 7b]
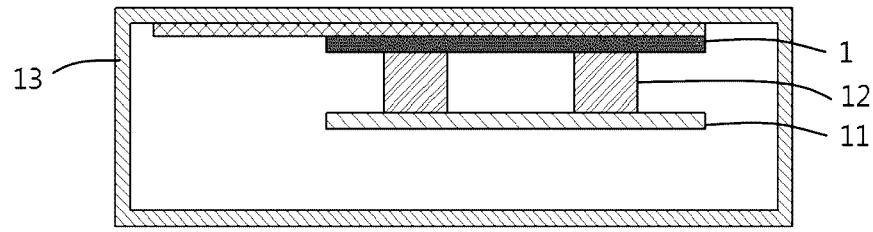
[Fig. 7c]
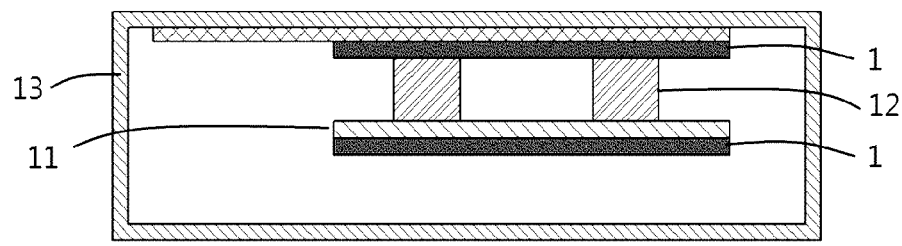

[Fig. 8a]
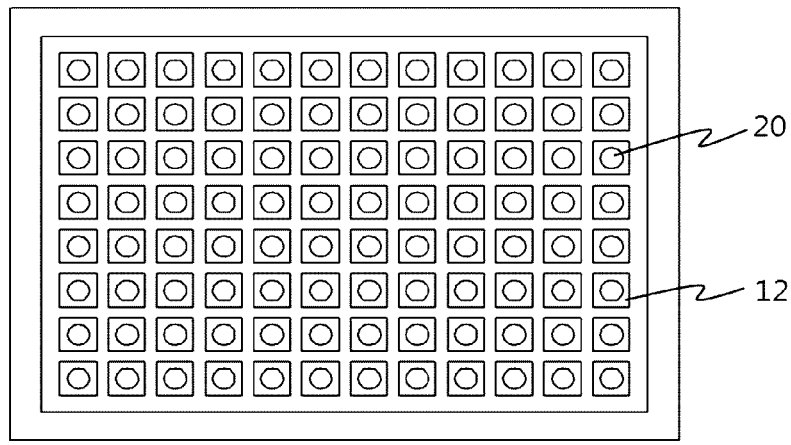
[Fig. 8b]
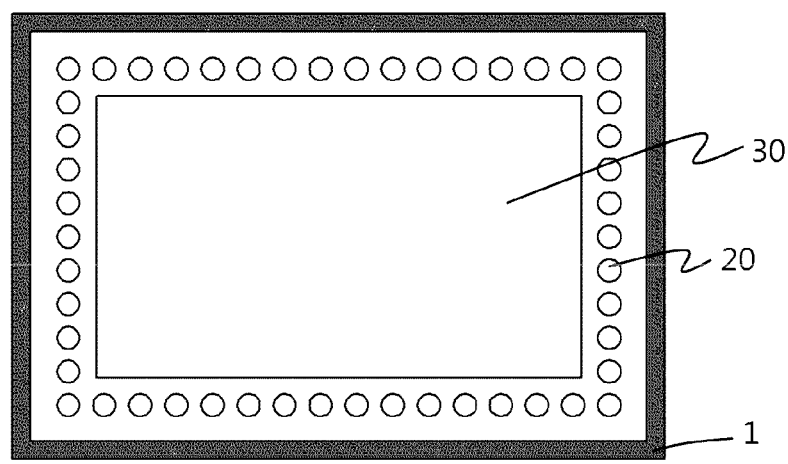

[Fig. 9a]
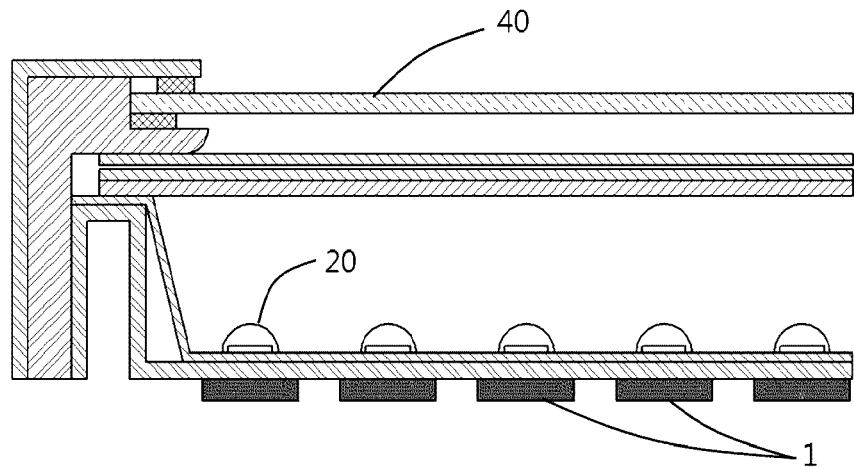
[Fig. 9b]
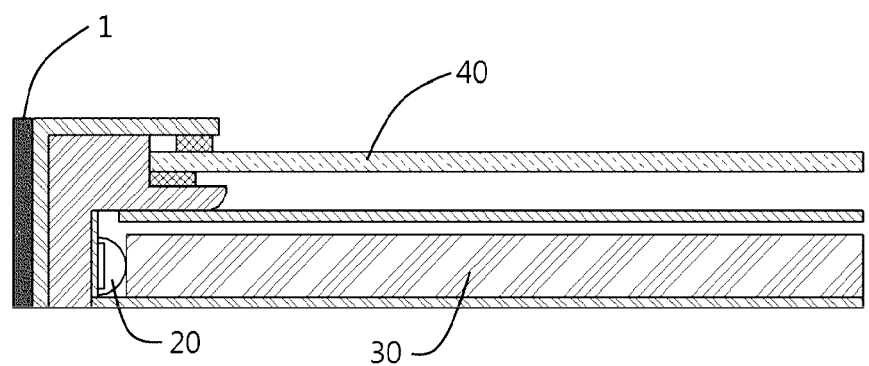

[Fig. 10]
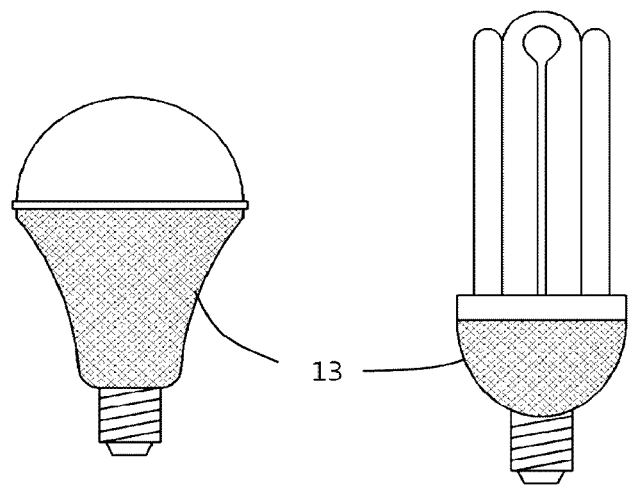
[Fig. 11]
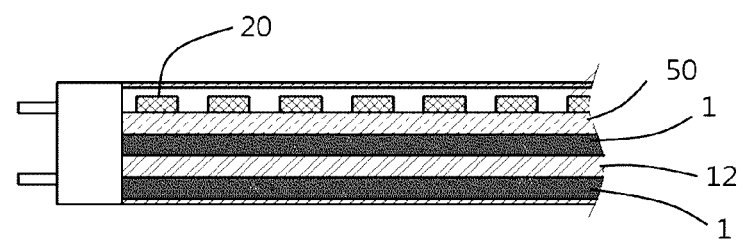

[Fig. 12]
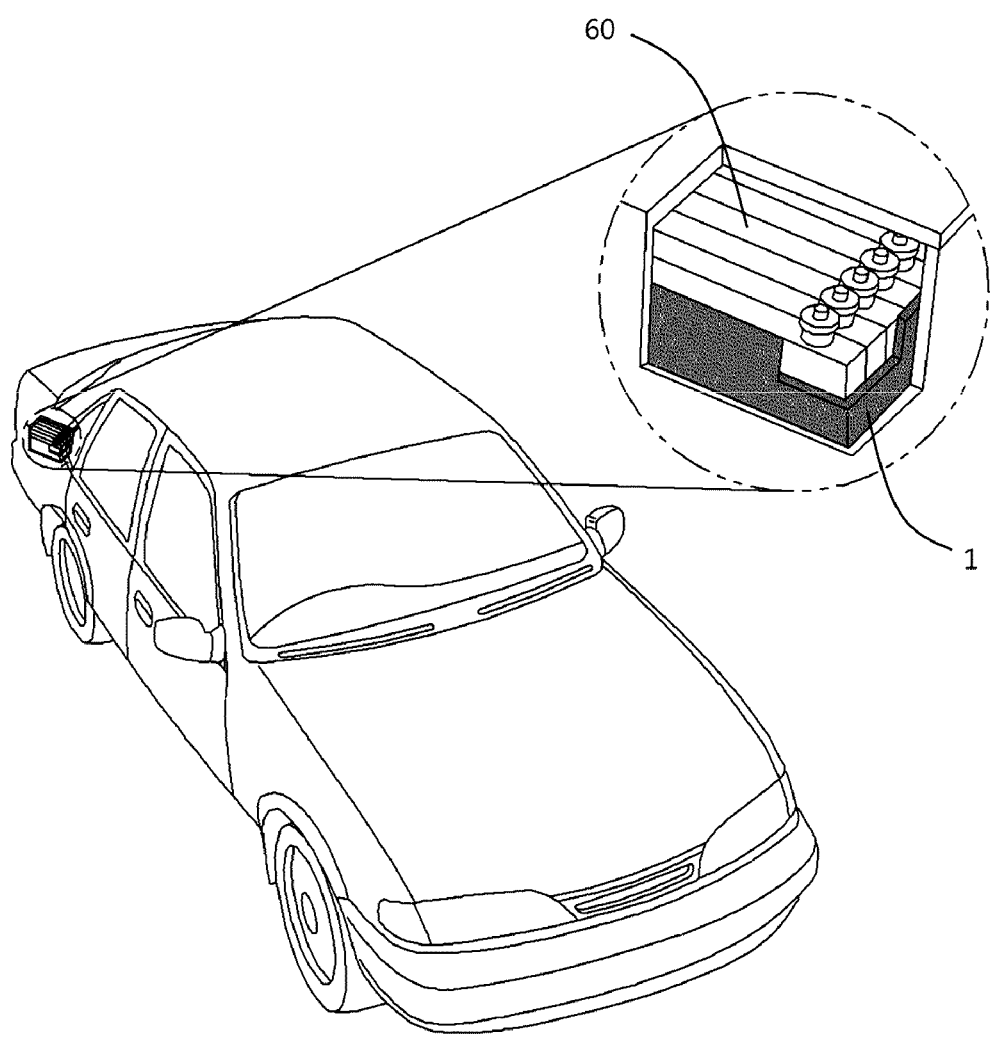

[Fig. 13a]
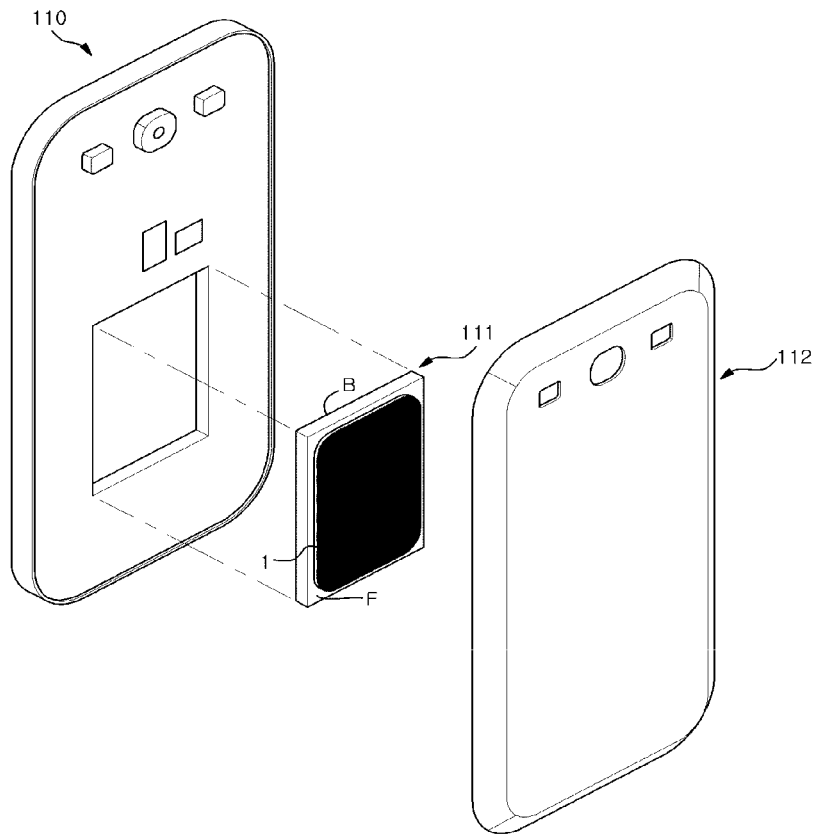
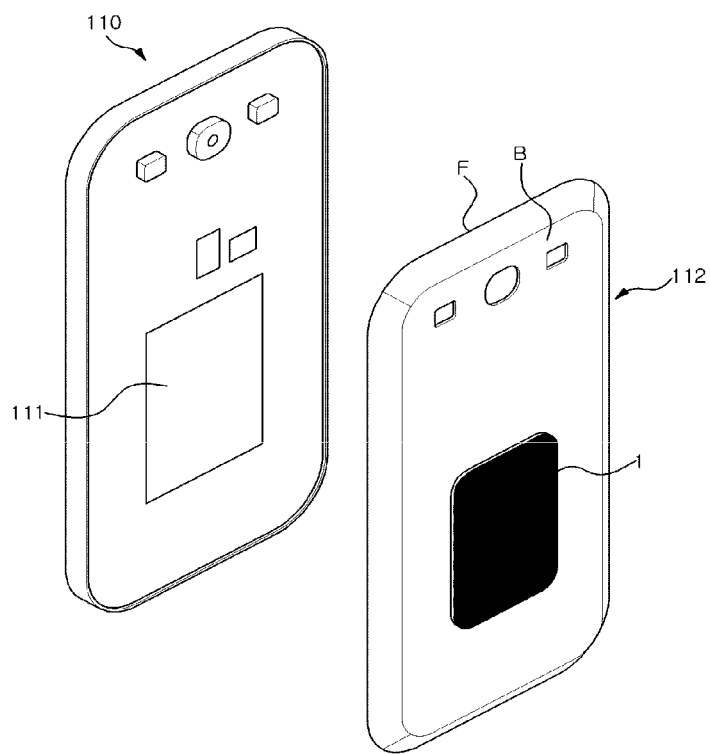

[Fig. 13b]
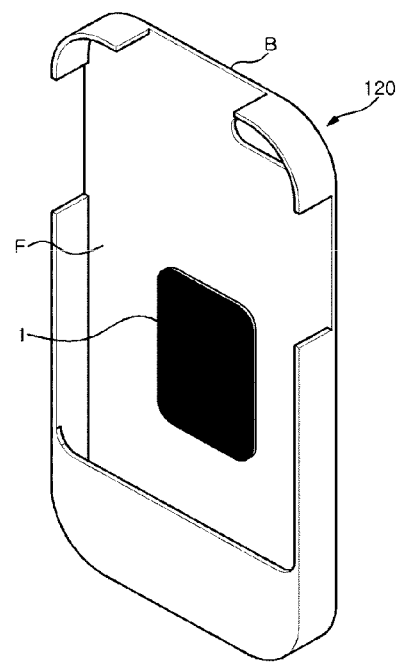
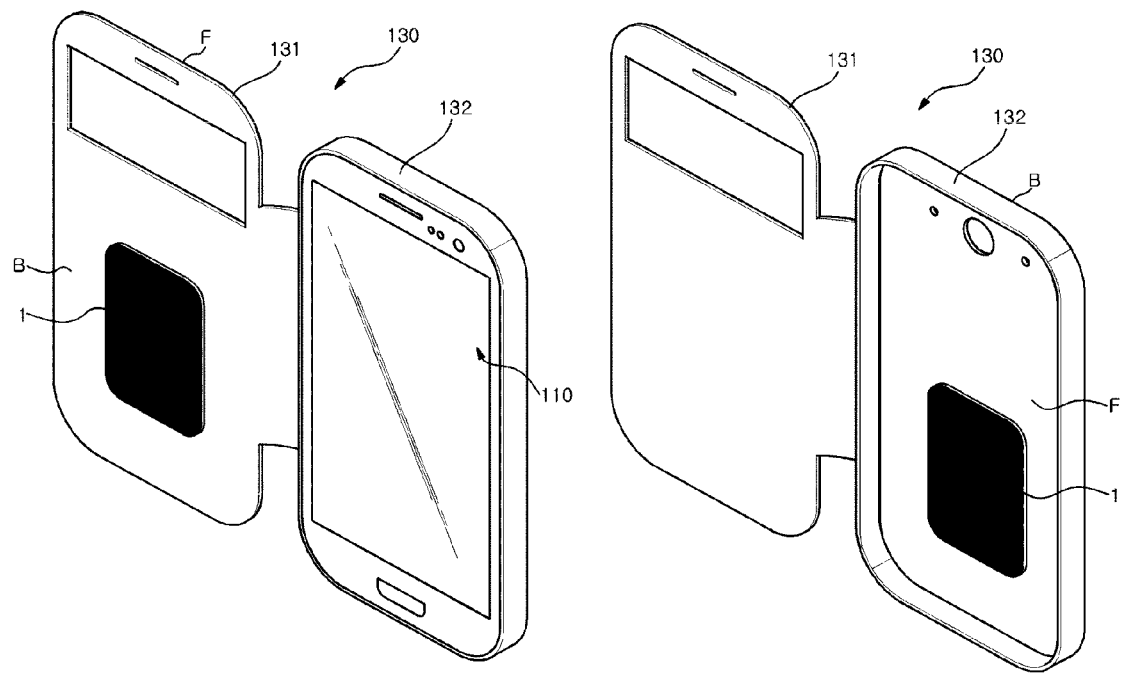

[Fig. 14a]
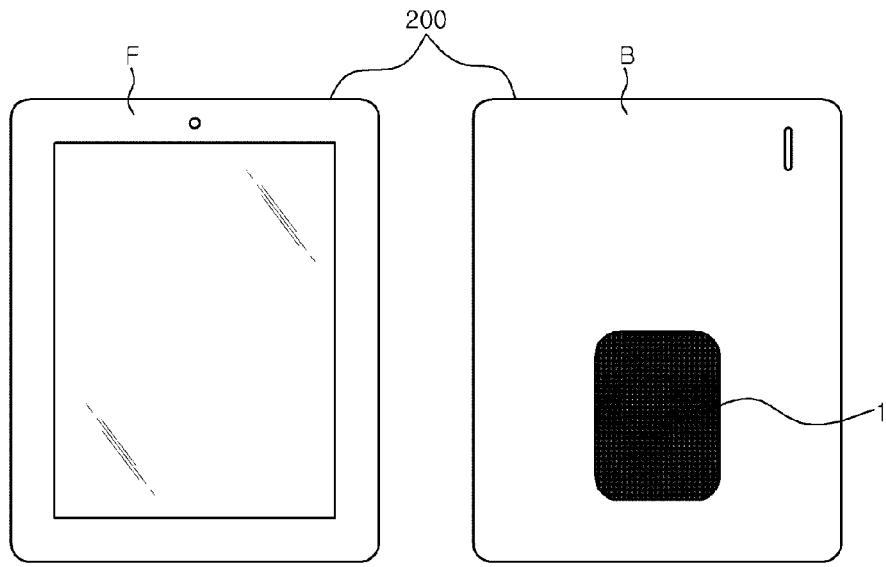
[Fig. 14b]
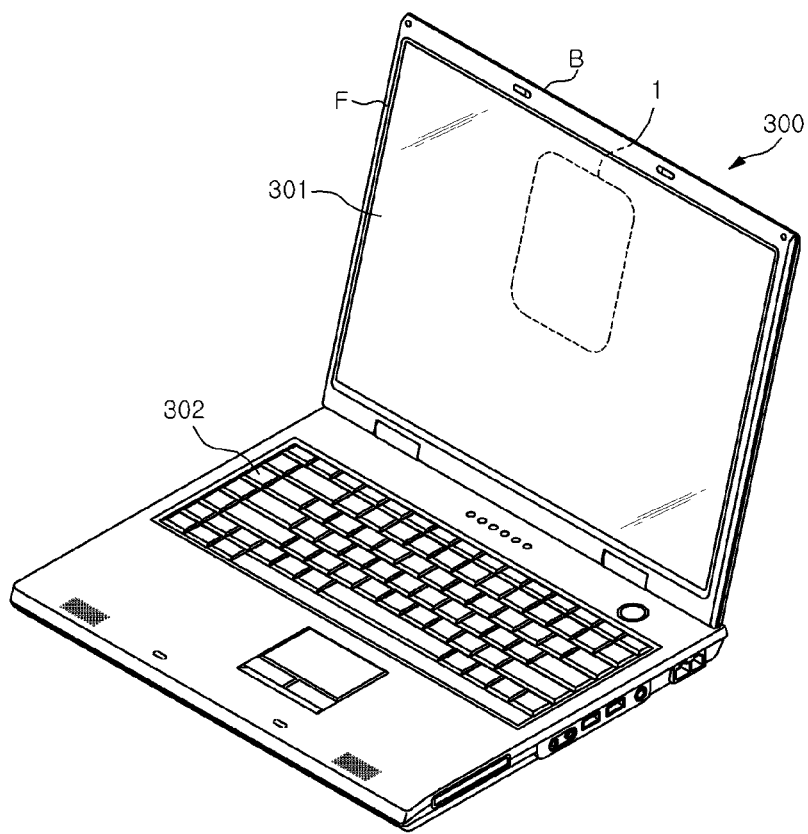

[Fig. 14c]
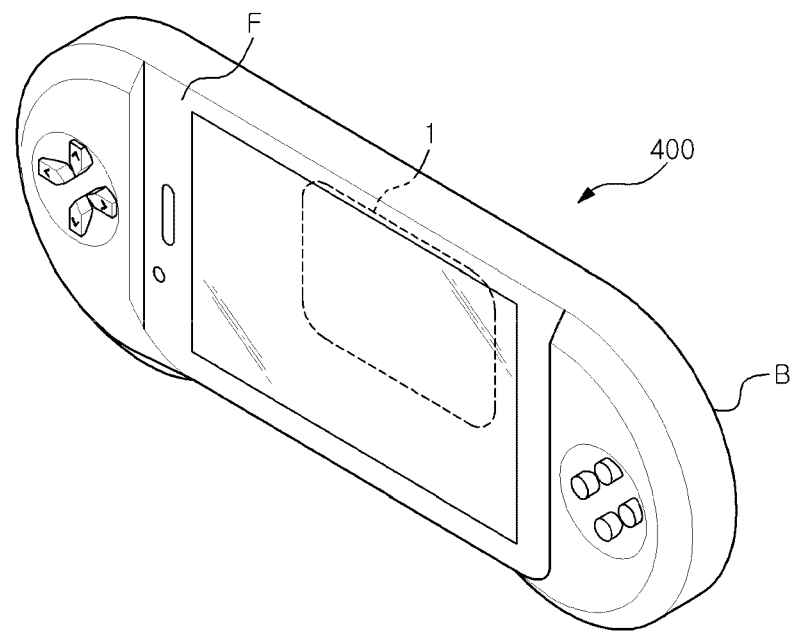
[Fig. 14d]
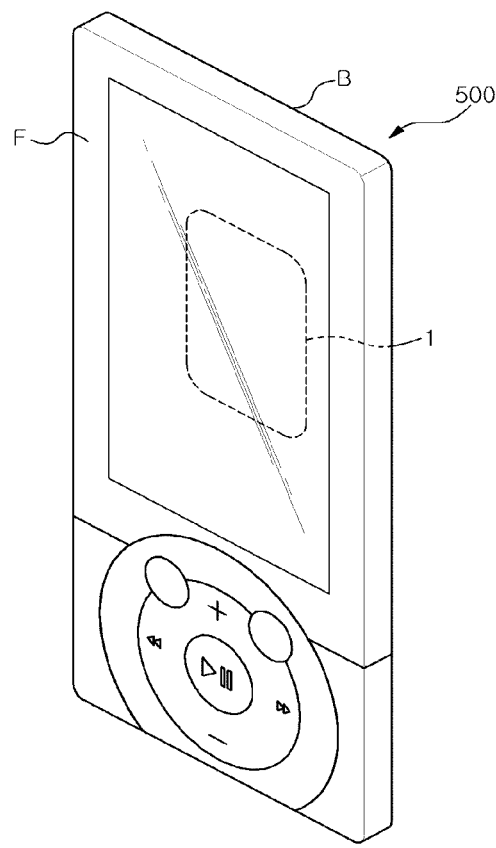

[Fig. 15a]
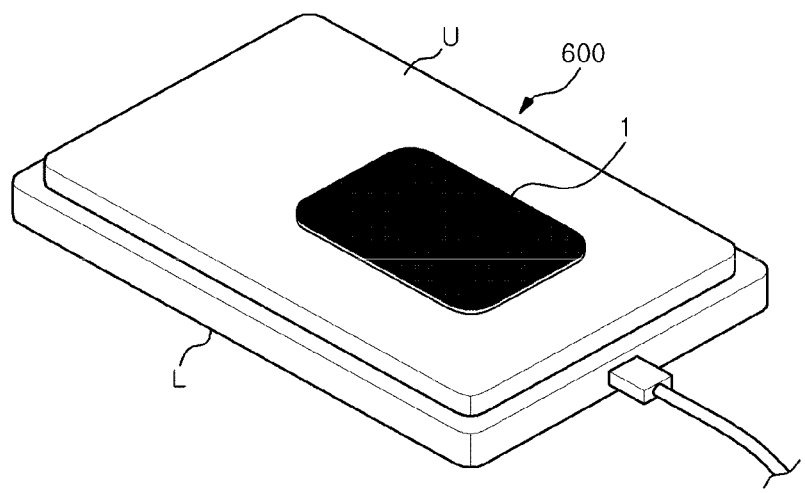
[Fig. 15b]
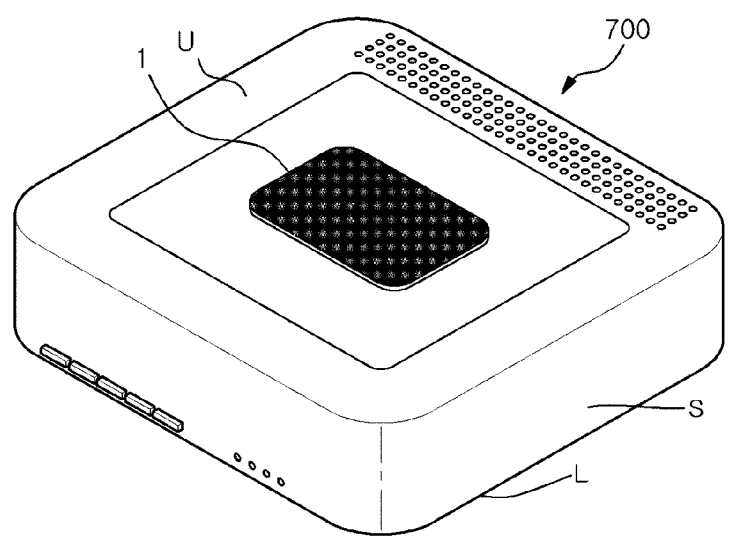

[Fig. 15c]
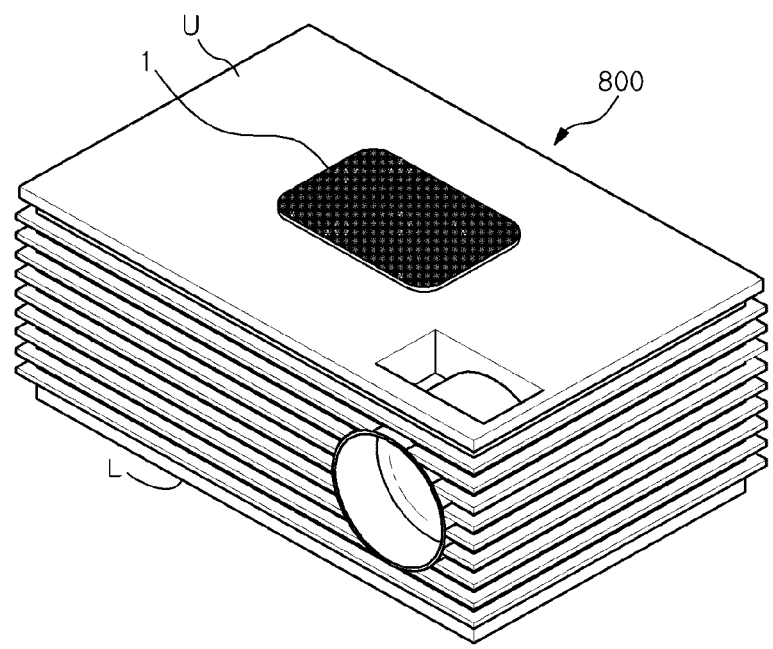
[Fig. 15d]
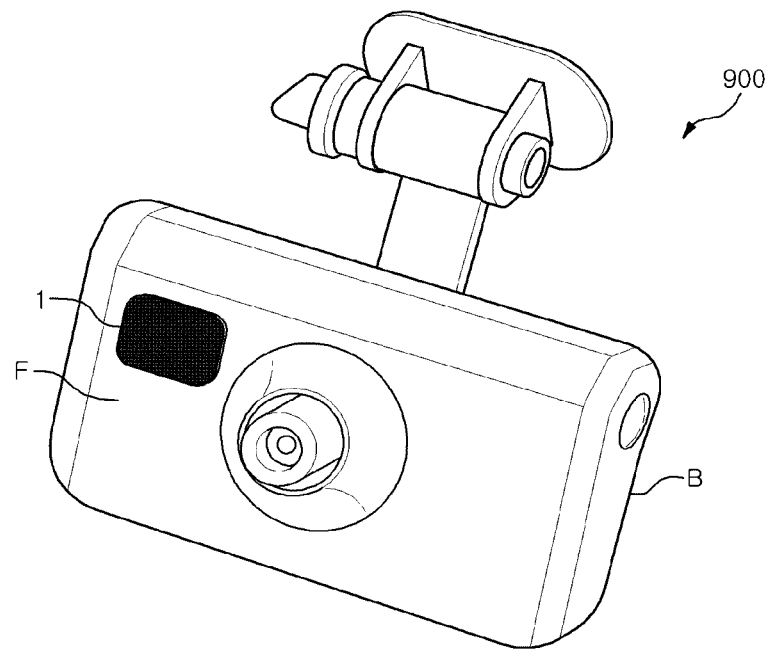

THERMALLY CONDUCTIVE THIN FILM SHEET AND ARTICLE COMPRISING SAME

CROSS REFERENCE TO RELATED APPLICATIONS

This Application is a National Stage of International Application No. PCT/KR2017/006189 filed Jun. 14, 2017, claiming priority based on Korean Patent Application 10-2016-0075643 filed Jun. 17, 2016.

TECHNICAL FIELD

The present invention relates to a thermally conductive thin sheet for protecting elements integrated in an electronic device from heat and to a process for manufacturing the same. Further, the present invention relates to an article comprising the thermally conductive thin sheet and to a method of dissipating heat from an article by using the thermally conductive thin sheet.

BACKGROUND ART

Recently, as electronic devices have been highly integrated and thinner in a rapid pace, the performance of chips mounted in such devices has been reinforced. This trend is spreading to not only electric/electronic devices but also automobiles, medical devices, and so on. As the chips used in electronic devices are highly integrated, heat is more generated, thereby causing many problems such as degradation in the performance of the electronic devices, malfunction of their peripheral devices, deterioration of their substrates, and the like. Especially, a thinner heat-dissipating material is required for a lighting device or an electronic device that employs an LED, an OLED, or the like. In this regard, a substrate on which IC chips are mounted is made of a metal PCB having good thermal conductivity, or a heat sink made of aluminum is used, to thereby control heat.

Further, a thermally conductive sheet that employs a carbon-based material (such as natural graphite and synthetic graphite), copper foil, or the like is mainly used for controlling heat in electronic devices (see Korean Patent No. 1509494).

Among these, a natural graphite sheet is generally manufactured by treating flaky graphite with a strong acid such as sulfuric acid and nitric acid, having the graphite expanded at a high temperature of 1000° C. or higher, subjecting it to acid washing, and rolling the washed graphite. This process, however, involves disadvantages that environmental contamination is generated and that expensive equipment is needed.

Further, due to its low tensile strength, this graphite sheet should be made to be thick for its handling convenience. When a thin graphite sheet is required, it is prepared by adding a UV curable resin or the like to expanded graphite, irradiating UV light thereto, and rolling the graphite for the purpose of enhancing the tensile strength of the graphite sheet thus produced. Further, a synthetic graphite sheet is superior in such performance as thermal conductivity and tensile strength as well as handling convenience to a natural graphite sheet. However, since a synthetic graphite sheet is manufactured by calcining an expensive polyimide film at high temperatures of 2,000 to 3,000° C., it requires expensive equipment along with high costs, and it is difficult to manufacture the sheet in the form of a roll in a width of 1,000 mm or more.

Copper foil has an intermediate level of thermal conductivity and tensile strength between a natural graphite sheet and a synthetic graphite sheet. Copper foil, however, has disadvantages that the manufacture of a thin copper foil involves high costs and that it is inconvenient to handle copper foil because it is not flexible and it is hardly restored once crumpled.

Accordingly, it is necessary to employ a thermally conductive thin sheet, which not only has high thermal conductivity and high tensile strength, but also is convenient to handle and economical, in an article such as an electronic device to thereby effectively dissipate heat generated during the use of the article.

DISCLOSURE OF INVENTION

Technical Problem

Accordingly, an object of the present invention is to provide a thermally conductive thin sheet having improved tensile strength and flexibility, while having a thermal conductivity equal to, or higher than, that of a conventional thermally conductive sheet such as a copper foil sheet.

Another object of the present invention is to provide a process for manufacturing the thermally conductive thin sheet in a convenient and effective manner.

Still another object of the present invention is to provide an article that employs the thermally conductive thin sheet therein to thereby effectively dissipate heat generated during the use of the article.

It is still another object of the present invention to provide a method of effectively dissipating heat generated in an article by using the thermally conductive thin sheet.

Solution to Problem

In accordance with the above object, the present invention provides a thermally conductive thin sheet, which comprises: (A) a thermally conductive adhesive film comprising (a) a composite filler comprising a carbon-based filler and a metallic filler, (b) a binder resin, and (c) an adhesive; and (B) thermally conductive filler layers formed on both sides of the thermally conductive adhesive film, wherein the thermally conductive filler layers are formed by pressing at least one thermally conductive filler in the form of a solid powder without an adhesive or a binder resin; the thermally conductive thin sheet has a tensile strength of 20 to 50 kg/mm$^2$ and a filler filling rate of 40 to 90 wt %; and the filler filling rate is the ratio represented in percent of the sum of weights of the composite filler and the thermally conductive filler contained in the thermally conductive thin sheet to the total weight of the thermally conductive thin sheet.

In accordance with another object, the present invention provides a process for manufacturing the thermally conductive thin sheet, which comprises: (1) preparing a thermally conductive composition comprising (a) a composite filler comprising a carbon-based filler and a metallic filler and (b) a binder resin; (2) blending an adhesive with the thermally conductive composition, then molding the thermally conductive composition in a sheet form, and drying the molded sheet to obtain a thermally conductive adhesive film; (3) forming thermally conductive filler layers on both sides of the thermally conductive adhesive film by coating at least one thermally conductive filler in the form of a solid powder without an adhesive or a binder resin to obtain a sheet; and (4) rolling the obtained sheet to press the solid particles of the thermally conductive filler to bond each other.

In accordance with another object, the present invention provides an article comprising the thermally conductive thin sheet.

In accordance with another object, the present invention provides a method of dissipating heat from an article by using the thermally conductive thin sheet.

Advantageous Effects of Invention

The thermally conductive thin sheet of the present invention has thermally conductive filler layers formed on both sides of a thermally conductive adhesive film comprising a composite filler. Thus, it has a high filler filling rate and is excellent in tensile strength and flexibility, to thereby render it convenient to handle.

Further, the thermally conductive thin sheet can be readily manufactured by coating a thermally conductive filler in the form of a solid powder on both sides of a thermally conductive adhesive film without an adhesive or a binder resin, followed by rolling the sheet thus prepared to press and bond the filler particles with each other.

Therefore, the thermally conductive thin sheet may be employed in various articles such as an electronic device and a lighting device in which a light emitting source such as an LED or an OLED is adopted or IC chips are highly integrated, to thereby effectively dissipate heat generated during the use thereof.

BRIEF DESCRIPTION OF THE DRAWINGS

FIG. 1 illustrates an example of the process for manufacturing the thermally conductive thin sheet of the present invention.

FIGS. 2a and 2b are images obtained by observing the surface of the thermally conductive adhesive film prepared in step (2) of Example 1 and the surface of the thermally conductive filler layer formed in step (3) by an electron microscope, respectively.

FIGS. 3a to 3c illustrate various examples of meshes for classifying a thermally conductive filler.

FIGS. 4a to 5b are graphs showing the temperatures at Points 1 and 2 of the heat source measured in Test Example 3 with respect to time elapsed.

FIGS. 6 to 15d illustrate examples in which the thermally conductive thin sheet of the present invention is employed in various articles.

[Reference Numerals of the Drawings]

1: thermally conductive thin sheet,
11: heat source,
12: heat sink,
13: casing,
20: LED element,
30: light guide plate,
40: optical film,
50: substrate,
60: battery cell,
110: cellular phone,
111: battery,
112: battery cover,
113: display unit,
114: bracket,
115: chipset substrate,
120: open-type cellular phone case,
130: folder-type cellular phone case,
131: cover unit,
132: housing unit,
200: tablet PC,
300: laptop PC,
301: display unit,
302: keyboard unit,
400: handheld game console,
500: MP3 player,
600: external hard disc drive,
700: set-top box,
800: beam projector,
900: car black box,
F: front side,
B: rear side,
U: top side,
L: bottom side,
S: side.

BEST MODE FOR CARRYING OUT THE INVENTION

Hereinafter, the present invention will be described in detail.

Thermally Conductive Thin Sheet

An embodiment of the present invention provides a thermally conductive thin sheet, which comprises: (A) a thermally conductive adhesive film comprising (a) a composite filler comprising a carbon-based filler and a metallic filler, (b) a binder resin, and (c) an adhesive; and (B) thermally conductive filler layers formed on both sides of the thermally conductive adhesive film, wherein the thermally conductive filler layers are formed by pressing at least one thermally conductive filler in the form of a solid powder without an adhesive or a binder resin; the thermally conductive thin sheet has a tensile strength of 20 to 50 kg/mm$^2$ and a filler filling rate of 40 to 90 wt %; and the filler filling rate is the ratio represented in percent of the sum of weights of the composite filler and the thermally conductive filler contained in the thermally conductive thin sheet to the total weight of the thermally conductive thin sheet.

Hereinafter, the components of the thermally conductive thin sheet will be described in detail.

(A) Thermally Conductive Adhesive Film

The thermally conductive adhesive film comprises (a) a composite filler comprising a carbon-based filler and a metallic filler, (b) a binder resin, and (c) an adhesive. The thermally conductive adhesive film may further comprise (d) a dispersant.

The thermally conductive adhesive film serves as a base layer for the thermally conductive filler layers and imparts flexibility to the sheet, while exhibiting thermal conductivity as it contains the composite filler therein.

The blending ratios of the respective components (a) to (d) are as follows.

The binder resin (b) may be comprised in an amount of 25 to 500 parts by weight per 100 parts by weight of the composite filler (a). If the binder resin is used in an amount less than the above range, heat transfer may be hampered due to a high specific surface area of the composite filler. If the binder resin is used in excess of the above range, the content of the composite filler may be too small, thereby rendering it difficult to exhibit the thermal characteristics. The binder resin (b) may also be comprised in an amount of 25 to 400 parts by weight, 60 to 200 parts by weight, 300 to 500 parts by weight, or 400 to 500 parts by weight, per 100 parts by weight of the composite filler (a).

The adhesive (c) may be blended in an amount of 5 to 40% by weight, preferably 10 to 30% by weight, more preferably 15 to 25% by weight, based on the weight of the thermally conductive adhesive film.

The dispersant (d) may be comprised in an amount of 0.1 to 10 parts by weight per 100 parts by weight of the composite filler (a). Particularly, the dispersant (d) may be comprised in an amount of 1 to 5 parts by weight per 100 parts by weight of the composite filler (a).

The thermally conductive adhesive film may be prepared through the step of dispersing the composite filler in a solvent mixture of an acetate-based solvent, an aromatic hydrocarbon solvent, and an alicyclic ketone solvent. That is, the composite filler may be dispersed in a solvent mixture of an acetate-based solvent, an aromatic hydrocarbon solvent, and an alicyclic ketone solvent. Accordingly, the composite filler may be well dispersed in the adhesive layer. For instance, the adhesive layer may be prepared by blending an adhesive with the dispersion solution obtained by dispersing the composite filler and the binder resin in the solvent mixture, and then molding the dispersion solution in a sheet form.

(a) Composite Filler

The composite filler comprises a carbon-based filler and a metallic filler. The composite filler may further comprise a non-metallic filler.

The metallic filler may be comprised in an amount of 20 to 400 parts by weight per 100 parts by weight of the carbon-based filler. Particularly, the metallic filler may be comprised in an amount of 20 to 80 parts by weight, or 40 to 60 parts by weight, per 100 parts by weight of the carbon-based filler. Alternatively, the metallic filler may be comprised in an amount of 150 to 400 parts by weight per 100 parts by weight of the carbon-based filler. Further, the non-metallic filler may be comprised in the composite filler in an amount similar to, or the same as, that of the metallic filler. When the respective fillers are used in amounts within the above preferable ranges, the dispersibility with the binder resin is excellent, resulting in more advantages curing and more excellent thermal conductivity.

(a1) Carbon-Based Filler

The thermally conductive composition comprises a carbon-based filler. For example, the carbon-based filler may be at least one of a natural graphite powder, an expanded graphite powder, a kish graphite powder, and a synthetic graphite powder.

A natural graphite powder having a purity of 99.7% or more may be used as the natural graphite powder. Further, a flaky graphite powder, which is crystalline natural graphite, may be used as the natural graphite powder.

Further, the expanded graphite powder may be prepared by treating a flaky graphite powder with an acid and heating it.

Also, the kish graphite powder may be obtained by refining the graphite component alone from a kish powder, which is a mixture of slag and graphite separated from molten pig iron or cast iron and floating on the surface thereof when the iron is cooled. The kish graphite powder may generally be in a flaky or platelet form. The kish graphite powder may impart high thermal conductivity to the thermally conductive composition.

The synthetic graphite powder may be obtained through carbonization and graphitization of polyimide (PI). Specifically, the synthetic graphite powder may be prepared by pulverizing a graphite sheet obtained by carbonizing and graphitizing a polyimide sheet. Here, the synthetic graphite sheet may have a horizontal thermal conductivity of 800 to 1,000 W/mK, an elongation strength of 25 MPa or more, and a density of 1.5 to 2.1 g/cm$^3$.

Further, a synthetic graphite powder, which is a coal-based or petroleum-based material and can be graphitized, may be used.

The carbon-based filler described above may have a particle diameter of 1 to 100 μm, preferably 1 to 50 μm, more preferably 1 to 10 μm. Specifically, the natural graphite powder and the expanded graphite powder each may have an average particle diameter of 3 to 10 μm, and the synthetic graphite powder may have an average particle diameter of 5 to 10 μm.

In addition, the total amount of the natural graphite powder and the expanded graphite powder in the carbon-based filler may be 99 wt % or more, preferably 99.5 wt % or more, more preferably 99.7 wt % or more.

The carbon-based filler may further comprise such a carbon-based filler as graphene, carbon nanotube, and carbon black in addition to the natural graphite powder, the expanded graphite powder, and the synthetic graphite powder. Carbon black among them may be in the form of a fine powder (about 1 μm) and comprised in the carbon-based filler in an amount of 0.001 to 10 wt % for the purpose of improving thermal conductivity and providing a coloring effect.

(a2) Metallic Filler

Further, the thermally conductive composition comprises a metallic filler.

The metallic filler may comprise at least one metal component selected from the group consisting of nickel, copper, gold, silver, tin, cobalt, and aluminum.

Alternatively, the metallic filler may comprise a meltable filler comprising Bi, Ga, In, Sn, or an alloy thereof. The meltable filler may optionally further comprise Ag, Au, Cd, Cu, Pb, Sb, Zn, or a combination thereof. Specific examples of the suitable meltable filler include Ga, In—Bi—Sn alloy, Sn—In—Zn alloy, Sn—In—Ag alloy, Sn—Ag—Bi alloy, Sn—Bi—Cu—Ag alloy, Sn—Ag—Cu—Sb alloy, Sn—Ag—Cu alloy, Sn—Ag alloy, Sn—Ag—Cu—Zn alloy, and a combination thereof.

The metallic filler may comprise one, two or more of the above-exemplified components.

According to an example, the metallic filler may comprise a metal particle having a coating layer, for example a silver-coated copper particle, a silver-coated nickel particle, a silver-coated aluminum particle, a tin-coated copper powder, and the like.

According to another example, the metallic filler may comprise a metallic particle that has a dendrite structure and contains at least one metal component.

More specifically, the metallic filler may comprise a copper particle having a dendritic structure, a silver-coated aluminum particle having a dendritic structure, or a silver-coated copper particle having a dendritic structure.

The metallic particle having a dendritic structure has a large specific surface area and a large number of functional groups, so that it fills up any gap in heat conduction. Thus, the metallic particle having a dendritic structure may have better thermal conductivity and electrical conductivity than those of a conventional metallic particle having a flaky or spherical form.

In case of the silver-coated copper particle having a dendritic structure, silver nanoparticles may be coated on the copper particle in an amount of 3 to 10 wt %.

According to a preferred example, the metallic filler may be a metallic particle that has a dendrite structure and contains at least one metal component, and the carbon-based filler may be a kish graphite powder.

The metallic filler may have an average particle diameter of 1 to 5 μm.

(a3) Non-Metallic Filler

The thermally conductive composition may further comprise a non-metallic filler that is thermally conductive in addition to the carbon-based filler and the metallic filler.

The non-metallic filler may be a non-carbon based, non-metallic filler, in which carbon is not a main component. For example, the non-metallic filler may comprise a metal nitride component such as boron nitride, silicon nitride, titanium nitride, and the like. Alternatively, the non-metallic filler may comprise a metal oxide component such as aluminum oxide (or alumina), zinc oxide, iron oxide, magnesium oxide, and beryllium oxide.

The non-metallic filler may have an average particle diameter of 1 to 5 μm.

(b) Binder Resin

The thermally conductive composition comprises a binder resin. The binder resin is not particularly limited as long as it is a polymer resin capable of serving as a binder for a graphite powder. It may be, for example, a curable binder resin.

Specific examples thereof may include a urethane resin, an acrylic resin, an epoxy resin, a phenolic resin, an amino resin, a vinyl resin, and a silicone resin. Among these, a thermosetting urethane resin, an acrylic resin, or a combination thereof is preferred.

As the acrylic resin, an acrylic copolymer resin containing polymethyl methacrylate as a main component may be used.

(c) Adhesive

The thermally conductive thin sheet comprises an adhesive. The adhesive may comprise a pressure-sensitive adhesive resin and a flexible resin.

As the pressure-sensitive adhesive resin, at least one selected from the group consisting of an acrylic adhesive resin, a phenoxy adhesive resin, a silicone adhesive resin, and an epoxy adhesive resin may be used.

Preferably, the pressure-sensitive adhesive resin may comprise an acrylic compound as a monomer. Specific examples of the acrylic compound may include methyl methacrylate, ethyl methacrylate, n-butyl methacrylate, isobutyl methacrylate, t-butyl methacrylate, 2-ethylhexyl methacrylate, lauryl methacrylate, methyl acrylate, ethyl acrylate, n-butyl acrylate, isobutyl acrylate, 2-ethylhexyl acrylate, octadecyl methacrylate, and a combination thereof.

Further, the flexible resin may comprise an olefin compound as a monomer. Specific examples of the olefin compound may include ethylene, propylene, butylene, and a combination thereof. Examples of other monomeric compounds that may be used may include styrene, vinyl chloride, vinyl acetate, acrylonitrile, and the like.

As an example, the adhesive may comprise the acrylic compound and the olefin compound in a weight ratio of 100:10 to 100:50. At this time, the acrylic compound may comprise n-butyl acrylate and 2-ethylhexyl methacrylate in the same amounts.

The adhesive may further comprise an organic solvent such as xylene, cyclohexanone, or the like as a diluent.

The adhesive may be blended in an amount of 5 to 40 wt %, preferably 10 to 30 wt %, more preferably 15 to 25 wt %, per 100 wt % of the thermally conductive adhesive film.

(d) Dispersant

The thermally conductive composition may further comprise a dispersant. The dispersant functions to further improve the dispersibility of fillers in the thermally conductive composition.

Specifically, the dispersant may have wettability and may be coated on the surface of filler particless to repel the molecules from each other, thereby increasing the intermolecular distance.

Specific examples of commercially available products that may be used as the dispersant may include Disperbyk-103, Disperbyk-110, Disperbyk-111, Disperbyk-180, Disperbyk-130, Disperbyk-115, Disperbyk-160, Disperbyk-161, Disperbyk-162, Disperbyk-163, Disperbyk-164, Disperbyk-166, Disperbyk-167, Disperbyk-169, Disperbyk-182, Disperbyk-170, Disperbyk-171, Disperbyk-174, Disperbyk-116, Disperbyk-140, Disperbyk-101, Disperbyk-107, Disperbyk-108, Disperbyk-183, Disperbyk-184, Disperbyk-185, Disperbyk-190, Anti-terra-203, Anti-terra-204, Anti-terra-205, Anti-terra-206, Anti-terra-U, Anti-terra-U80, Bykumen supplied by BYK. Preferably, Disperbyk-160 may be used.

The dispersant may have a pH ranging from about 6 to about 8.

The dispersant functions to disperse the thermally conductive fillers on the polymeric adhesive resin and helps the improvement of the surface state. However, it does not play a significant role in the present invention since the thermally conductive adhesive film may have an uneven surface.

Characteristics of the Thermally Conductive Adhesive Film

The thickness of the thermally conductive adhesive film may be in the range of 1 to 2,000 µm, more specifically in the range of 1 to 1,000 µm, 1 to 500 µm, 1 to 200 µm, 1 to 100 µm, 1 to 50 µm, or 1 to 20 µm, and may be adjusted to various ranges depending on the application.

The thermally conductive adhesive film has adhesiveness on its surface. For example, the thermally conductive adhesive film may have an adhesive strength of 100 to 2,000 gf/25 mm$^2$, more specifically 200 to 1,000 gf/25 mm$^2$. If the adhesive strength is too high beyond the above-mentioned preferable range, the thermal conductivity performance may be hampered. To the contrary, if the adhesive strength is too low below the above-mentioned preferable range, the adhesion to the thermally conductive filler layers may deteriorate.

The thermally conductive adhesive film may consist of a single layer.

Alternatively, the thermally conductive adhesive film may consist of two or more layers. For example, the thermally conductive adhesive film may have a structure in which a polymer resin layer is provided as a core layer and thermally conductive adhesive layers are formed on both sides of the polymer resin layer. That is, the thermally conductive adhesive film, which consists of a thermally conductive adhesive layer/a polymer resin layer/a thermally conductive adhesive layer, may further improve the tensile strength and handling convenience. At this time, the respective thermally conductive adhesive layers comprise a composite filler comprising a carbon-based filler and a metallic filler, a binder resin, and an adhesive.

Further, the polymer resin layer may comprise at least one selected from the group consisting of polypropylene (PP), polyethylene (PE), polystyrene (PS), acrylonitrile-butadiene-styrene copolymer (ABS), polycarbonate (PC), polyoxymethylene (POM), polyamide (PA), polypropylene oxide (PPO), polybutylene terephthalate (PBT), polyethylene terephthalate (PET), polyvinyl chloride (PVC), polymethylmethacrylate (PMMA), polytetrafluoroethylene (PTFE), polyetheretherketone (PEEK), polyphenylene sulfide (PPS), polyimide (PI), polyamide-imide (PAI), polyethyleneimine (PEI), and a combination thereof.

(B) Thermally Conductive Filler Layer

The thermally conductive filler layers are formed on both sides of the thermally conductive adhesive film.

The thermally conductive filler layers enhance the filler filling rate of the thermally conductive thin sheet, thereby rapidly dissipating heat generated in various electronic devices.

FIGS. 2a and 2b are electron microscope photographs showing the surface of a thermally conductive adhesive film and the surface of a thermally conductive filler layer, respectively. They show that the thermally conductive filler layer has a much higher filling rate of thermally conductive fillers than that of the thermally conductive adhesive film.

If the thermally conductive adhesive film alone is used without the thermally conductive filler layers, the filler filling rate of the thermally conductive adhesive film is limited, so that it is difficult to expect excellent performance in terms of thermal conductivity.

The thermally conductive filler layers comprise a thermally conductive filler. The thermally conductive filler that may be used herein may comprise a carbon-based filler, a metallic filler, or a thermally conductive non-metallic powder. For example, as the thermally conductive filler, at least one of the carbon-based filler, the metallic filler, and the non-metallic filler used for the thermally conductive adhesive film may be used. At this time, the blending ratio between the fillers is as exemplified above with respect to the thermally conductive adhesive film.

The thermally conductive filler layers do not comprise an adhesive or a binder. Specifically, the thermally conductive filler layers consist of at least one thermally conductive filler devoid of an adhesive or a binder resin. More specifically, the thermally conductive filler layers are formed by pressing at least one thermally conductive filler in the form of a solid powder without an adhesive or a binder resin.

The thermally conductive filler layers may have a thickness of 10 to 2,000 μm, specifically 20 to 1,000 μm, or 25 to 500 μm.

If the thermally conductive filler layers alone are used, the tensile strength is low, which may hamper the handling convenience. However, since the thermally conductive filler layers are formed on both side of the thermally conductive adhesive film in the present invention, the tensile strength may be further improved.

As a result, the thermally conductive thin sheet may have a high filler filling rate as well as excellent tensile strength.

Characteristics of the Thermally Conductive Thin Sheet

The thermally conductive thin sheet consists of a flexible thin film having a high filler filling rate.

The thermally conductive thin sheet may have a filler filling rate of 40 to 90 wt %, specifically 50 to 90 wt %, 40 to 80 wt %, 50 to 80 wt %, or 60 to 80 wt %.

Here, the filler filling rate indicates the ratio represented in percent of the sum of weights of the entire fillers (the composite filler and the thermally conductive filler) contained in the thermally conductive thin sheet to the total weight of the thermally conductive thin sheet.

Further, the total thickness of the thermally conductive thin sheet may be 10 to 2,000 μm, specifically 15 to 1,500 μm, 20 to 1,000 μm, or 25 to 500 μm.

As a result, the thermally conductive thin sheet may have an excellent tensile strength of 20 to 50 kg/mm$^2$, 25 to 50 kg/mm$^2$, or 30 to 50 kg/mm$^2$, for example, in the range of 25 to 45 kg/mm$^2$, 25 to 40 kg/mm$^2$, or 25 to 35 kg/mm$^2$, more specifically in the range of 28 to 32 kg/mm$^2$.

According to a preferred example, the thermally conductive thin sheet has a total thickness of 20 to 1,000 μm, a filler filling rate of 50 to 90 wt %, and a tensile strength of 25 to 50 kg/mm$^2$.

According to another preferred example, the thermally conductive thin sheet has a total thickness of 25 to 500 μm, a filler filling rate of 60 to 90 wt %, and a tensile strength of 30 to 50 kg/mm$^2$ Process for Manufacturing the Thermally Conductive Thin Sheet Another embodiment of the present invention provides a process for manufacturing the thermally conductive thin sheet, which comprises: (1) preparing a thermally conductive composition comprising (a) a composite filler comprising a carbon-based filler and a metallic filler and (b) a binder resin; (2) blending an adhesive with the thermally conductive composition, then molding the thermally conductive composition in a sheet form, and drying the molded sheet to obtain a thermally conductive adhesive film; (3) forming thermally conductive filler layers on both sides of the thermally conductive adhesive film by coating at least one thermally conductive filler in the form of a solid powder without an adhesive or a binder resin to obtain a sheet; and (4) rolling the obtained sheet to press the solid particles of the thermally conductive filler to bond each other.

FIG. 1 illustrates an example of the process for manufacturing the thermally conductive thin sheet of the present invention.

Hereinafter, the above manufacturing process will be described in detail step by step.

(1) Preparation of a Thermally Conductive Composition

In step (1) above, a thermally conductive composition comprising (a) a composite filler comprising a carbon-based powder and a metallic filler and (b) a binder resin is prepared.

According to a preferred example, step (1) may comprise (1a) preparing a carbon-based filler; (1b) adding the carbon-based filler to a solvent mixture of an acetate solvent, an aromatic hydrocarbon solvent, and an alicyclic ketone solvent and stirring them to obtain a first dispersion solution; (1c) adding a metallic filler to the first dispersion solution and stirring them to obtain a second dispersion solution; and (1d) adding a binder resin to the second dispersion solution and stirring them to obtain a liquid composition.

In the preferred example above, the metallic filler is used in an amount of 20 to 400 parts by weight per 100 parts by weight of the carbon-based filler, the solvent mixture is used in an amount of 300 to 500 parts by weight per 100 parts by weight of the sum of the carbon-based filler and the metallic filler, and the binder resin is used in an amount of 25 to 500 parts by weight per 100 parts by weight of the composite filler, wherein the solvent mixture may be a mixture of an acetate solvent, an aromatic hydrocarbon solvent, and an alicyclic ketone solvent in a weight ratio of 1:1-2:3-7.

Further, the manufacturing process may further comprise preparing a non-metallic filler; and adding the non-metallic filler to the first dispersion solution or the second dispersion solution and stirring them. The specific types and blending amounts of the non-metallic filler are as exemplified above.

(1a) Preparation of a Carbon-Based Filler

In step (1a) above, a carbon-based filler is prepared. For example, as the carbon-based filler, at least one of a natural graphite powder, an expanded graphite powder, a kish graphite powder, and a synthetic graphite powder may be prepared.

A natural graphite powder having a purity of 99.7% or more may be used as the natural graphite powder. For example, a flaky graphite powder, which is crystalline natural graphite, may be used as the natural graphite powder.

Further, as the natural graphite powder, an expanded graphite powder may be used. The expanded graphite powder may be prepared by (i) classifying and extracting natural flaky graphite with a mesh; (ii) mixing the extracted graphite with an oxidizing agent and then intercalating the graphite by applying an electric current thereto; and (iii) heating and expanding the intercalated graphite.

These graphite materials are classified into particles of a desired size with a mesh having a size of, for example, 200 or more, furthermore 300 or more. It is preferable to use a mesh having a size of 400 or more, for example, about 400 to 500, for the preparation of a graphite powder.

A grating mesh may be used as the shape of the mesh. For specific shapes of the mesh, with reference to FIGS. 3a to 3c, (i) a grating mesh having rectangular holes, (ii) a grating mesh having square holes and rectangle holes together, or (iii) a grating mesh having square holes may be used. The classification of graphite particles may be carried out with one of these meshes or a combination thereof.

The size of the graphite particles, which have been subjected to the classification step, may be 1 to 30 μm, preferably 10 to 20 μm.

The classified graphite is subjected to treatment with an oxidizing agent for intercalation. The oxidizing agent may be a first oxidizing agent selected from the group consisting of sulfuric acid, nitric acid, and a mixture thereof. Here, sulfuric acid or nitric acid in a concentration of less than 5%, for example, in a concentration of 0.1% to less than 5%, may be used.

If the first oxidizing agent alone is used, such ions as $SO_3$ of sulfuric acid strongly bound to water molecules may exist, which may render it difficult for intercalation to take place. Accordingly, a second auxiliary oxidizing agent may be further used in the treatment with the first oxidizing agent. For example, a second auxiliary oxidizing agent selected from the group consisting of perchloric acid, hydrogen peroxide, chromic acid, boric acid, a sodium-based material, tetrahydrofuran, $ZnCl_2$, and a combination thereof may be used.

The weight ratio of the first oxidizing agent to the second auxiliary oxidizing agent may be 1:100 to 50:100, particularly 1:100 to 20:100, more particularly 1:100 to 10:100.

The above process is more environment friendly since it uses a small amount of an oxidizing agent in a low concentration as an intercalation material as compared with the conventional process that uses a large amount of an oxidizing agent in a high concentration.

An electric current may be applied to the reactants during the oxidizing agent treatment. The application of an electric current facilitates intercalation even if graphite is treated with a small amount of an oxidizing agent in a low concentration. That is, if an electric current is applied in the oxidizing agent treatment in a manner similar to electrolysis, intercalation can be carried out even with a small amount of an oxidizing agent in a low concentration.

The application of an electric current may be conducted at a current density of 1 to 20 $A/dm^2$, specifically at a current density of 4 to 10 $A/dm^2$. More specifically, the application of an electric current may be conducted at a current density of 4 to 6 $A/dm^2$ or at a current density of 6 to 10 $A/dm^2$. Further, the application of an electric current may be conducted for 1 to 30 seconds, specifically for 5 to 10 seconds.

The graphite intercalated as described above is subjected to repeated washing and drying for use in the next step. Conventionally, the washing after the oxidizing agent treatment generates waste acids and various oxidizing agents, involving difficulties in dealing with these wastes. The process described above, however, rarely generates waste acids, and it may be carried out by adding a solvent.

The graphite, which has been subjected to washing and drying, is heated at high temperatures to produce expanded graphite. As a result, the graphite expands about 80 to 400 times the initial volume, for example 200 to 400 times the initial volume. Preferably, the graphite expands about 300 to 400 times the initial volume. As the expansion volume is larger, a graphite thin film is easily prepared, and the uniformity is more improved.

As a result, a uniform graphite powder having an average particle diameter of about 10 to 20 μm may be prepared.

Alternatively, a natural graphite powder may be prepared by a process of thermally treating a raw material in a powder form without subjecting it to the process of forming a graphite sheet.

Also, a kish graphite powder may be prepared by pulverizing primary graphite, which crystallizes directly from the melt in predominantly hypereutectic cast iron. Specifically, a kish graphite powder may be obtained by separating graphite floating on the surface of molten cast iron when carbon is present in excess of the process component, for which a modified dissolution method may be used. Further, a kish graphite powder may be pulverized into a spherical fine powder with an air jet mill for use.

A synthetic graphite powder may be prepared by finely pulverizing a synthetic graphite sheet obtained by calcining a polyimide (PI) sheet. Further, a synthetic graphite powder (graphene, carbon black, carbon fiber, carbon nanotubes, or the like) obtained from a petroleum-based or coal-based material may be finely pulverized with an air jet mill for use.

The calcination may be performed in two steps, specifically first calcination performed at a temperature of at least about 400° C. to carbonize a polyimide sheet, and second calcination performed at a temperature of at least 2,000° C. to graphitize the carbonized sheet.

The synthetic graphite sheet thus obtained may have a horizontal thermal conductivity of 800 to 1,000 W/mk or more, an elongation strength of 25 MPa or more, and a density of 1.5 to 2.1 $g/cm^3$ or more.

Thereafter, the graphite sheet is pulverized to obtain a uniform graphite powder having an average particle diameter of about 3 to 10 μm.

At least one of the carbon-based fillers thus prepared may be mixed and stirred at room temperature for use. The blending ratio of the one or more carbon-based fillers is as exemplified above.

(1b) Preparation of a First Dispersion Solution

In step (1b) above, the carbon-based filler is added to a solvent mixture, which is stirred to obtain a first dispersion solution.

The solvent mixture is a mixture of an acetate solvent, an aromatic hydrocarbon solvent, and an alicyclic ketone solvent. The solvent mixture in combination of the above solvents not only serves as a solvent for fillers but also provides a thermally conductive composition having excellent dispersibility of the fillers therein.

Specifically, examples of the acetate solvent may include ethyl acetate, butyl acetate, propylene glycol methyl ether acetate, and the like.

Further, examples of the aromatic hydrocarbon solvent may include toluene, pyridine, quinoline, anisol, mesitylene, xylene, and the like.

Further, examples of the alicyclic ketone solvent may include 1-methyl-2-pyrrolidone, cyclohexanone, isophorone, and the like.

As the solvent mixture, an acetate solvent, an aromatic hydrocarbon solvent, and an alicyclic ketone solvent may be mixed in a weight ratio of 1:1-2:3-7. When the preferred solvents are mixed in amounts within the preferred range as mentioned above, the dispersibility of fillers can be further improved.

In this step, a dispersant may be further used, and specific examples of the dispersant used herein are as exemplified above. Preferably, the stirring in this step comprises stirring under vacuum. More preferably, the stirring comprises stirring under vacuum at 20 to 60 rpm and 1 to 5 hours. Even more preferably, the stirring comprises stirring under vacuum at 30 to 40 rpm and 1 to 3 hours.

(1c) Preparation of a Second Dispersion Solution

In step (1c) above, a metallic filler is added to the first dispersion solution, which is stirred to obtain a second dispersion solution. Preferably, the stirring in this step comprises stirring in the forward direction and then stirring in the reverse direction under atmospheric pressure.

Specifically, the stirring in the forward direction may be performed under the conditions of 10 to 50 rpm and 5 to 30 minutes under atmospheric pressure. More preferably, the stirring in the forward direction may be performed under the conditions of 20 to 40 rpm and 10 to 20 minutes under atmospheric pressure.

Specifically, the stirring in the reverse direction may be performed under the conditions of 1 to 20 rpm and 10 to 30 minutes under atmospheric pressure. More preferably, the stirring in the reverse direction may be performed under the conditions of 5 to 15 rpm and 15 to 25 minutes under atmospheric pressure.

(1d) Preparation of a Thermally Conductive Composition

In step (1d) above, a binder resin is added to the second dispersion solution, which is stirred to obtain a composition. Preferably, the stirring in this step comprises stirring in the forward direction under vacuum and then stirring in the reverse direction under atmospheric pressure.

Specifically, the stirring in the forward direction may be performed under the conditions of 10 to 40 rpm and 30 minutes to 3 hours under vacuum. More preferably, the stirring in the forward direction may be performed under the conditions of 20 to 30 rpm and 1 to 2 hours under vacuum.

Specifically, the stirring in the reverse direction may be performed under the conditions of 1 to 10 rpm and 1 to 20 minutes under atmospheric pressure. More preferably, the stirring in the reverse direction may be performed under the conditions of 3 to 7 rpm and 5 to 15 minutes under atmospheric pressure.

After the stirring, the composition may further be subjected to ultrasonic treatment. Preferably, the ultrasonic treatment may be performed at a frequency of 80 to 200 kHz for 10 to 30 minutes. Such ultrasonic treatment enhances the dispersibility between the fillers, thereby further improving the intermolecular arrangement.

The thermally conductive composition prepared in step (1) above may be a liquid composition.

As an example, the thermally conductive composition comprises (a) a composite filler comprising a carbon-based filler and a metallic filler, (b) a binder resin, and (e) a solvent mixture of an acetate solvent, an aromatic hydrocarbon solvent, and an alicyclic ketone solvent.

In this case, the solvent mixture (e) may be comprised in an amount of 300 to 500 parts by weight per 100 parts by weight of the composite filler (a). More specifically, the solvent mixture (e) may be comprised in an amount of 350 to 450 parts by weight per 100 parts by weight of the composite filler (a).

The thermally conductive composition is characterized in that the composite filler is uniformly dispersed in the liquid composition. Preferably, the thermally conductive composition may have a dispersion distribution with a zeta potential ranging from 20 to 100 mV, more preferably from 70 to 100 mV, at a pH of 5 to 8.

A graphite powder has low wettability, excellent mechanical properties, and high conductivity, whereas it has low dispersibility, high re-coagulability, and high viscosity due to the affinity to coagulation by virtue of the van der Waals forces as an intermolecular force, making it difficult to produce a uniform composite material. Thus, when a graphite powder is dispersed in an organic solvent with a binder resin in order to provide a coating composition, there exist difficulties that the graphite particles coagulate with each other without being uniformly dispersed due to the characteristics of the graphite particles. In contrast, according to the present invention, the thermally conductive composition can improve the dispersibility of a graphite powder due to the combination of the above-mentioned solvents.

In addition, in the present invention, the dispersibility can be further improved by adding a dispersant for the dispersion of the fillers and adopting various dispersion steps (such as ultrasonic treatment and stirring).

(2) Preparation of a Thermally Conductive Adhesive Film

In step (2) above, an adhesive is blended with the thermally conductive composition, which is molded in a sheet form and dried to obtain a thermally conductive adhesive film.

(2a) Preparation of an Adhesive Composition

According to a preferred example, step (2) comprises: (2a) blending an adhesive with the thermally conductive composition obtained in the previous step to prepare an adhesive composition; and (2b) molding the adhesive composition in a sheet form and drying it to produce a thermally conductive adhesive film.

In step (2a) above, an adhesive is blended with the composition obtained in the previous step to prepare an adhesive composition.

As an example, the adhesive may be prepared by polymerizing an acrylic compound as a monomer. At this time, it is important to appropriately adjust the glass transition temperature (Tg), crosslinking degree, and polymerization uniformity of the acrylic polymer finally polymerized.

Alternatively, the adhesive may be prepared by polymerizing an olefin compound as a monomer.

Specific examples of the acrylic compound, the olefin compound, and other monomer compounds additionally available are as exemplified above. Further, the composition of the preferable adhesive (the specific kinds of the compounds to be comprised in the adhesive and their blending ratio) is as exemplified above.

The temperature at the time of blending the adhesive with the thermally conductive composition is preferably 20 to 50° C., more specifically 20 to 30° C. The blending of the adhesive with the thermally conductive composition is preferably carried out at this temperature condition for 2 to 4 hours, more specifically for 2 to 3 hours. When the blending is carried out within the above-described preferable temperature range, the molecules may be meso-phased due to the heating, so that their arrangement may be more excellent.

Further, the amount of the adhesive to be added is as exemplified above.

The composition thus prepared is preferably adjusted to have a viscosity of 100 to 400 cPs by using an appropriate amount of an organic solvent.

(2b) Preparation of a Thermally Conductive Adhesive Film

In step (2b) above, the adhesive composition obtained in the previous step is molded in a sheet form and dried to obtain a thermally conductive adhesive film.

The thermally conductive adhesive film may be prepared in a single layer.

Alternatively, the thermally conductive adhesive film may be prepared in two or more layers. For example, the thermally conductive adhesive film may be provided with a polymer resin layer.

As an example, the adhesive composition obtained in the previous step is coated onto a polymer resin layer, to thereby provide a thermally conductive adhesive film having a polymer resin layer on one side thereof.

As another example, the adhesive composition obtained in the previous step is coated onto both sides of a polymer resin layer, to thereby provide a thermally conductive adhesive film having a polymer resin layer as a core layer.

The polymer resin layer may comprise a polymer resin, specific examples of which are as exemplified above in the description with respect to the thermally conductive adhesive film.

Alternatively, the thermally conductive adhesive film may be prepared without a polymer resin layer.

The thermally conductive adhesive film thus prepared may be subjected to thermal drying. The thermal drying may be performed at a temperature of, for example, 40 to 60° C. The thermal drying may be performed for 12 to 96 hours, or 24 to 72 hours.

(3) Formation of Thermally Conductive Filler Layers

In step (3), thermally conductive filler layers are formed by coating at least one thermally conductive filler in the form of a solid powder on both sides of the thermally conductive adhesive film prepared in the previous step without the use of an adhesive or a binder resin.

The thermally conductive filler used for forming the thermally conductive filler layers may comprise a carbon-based filler, a metallic filler, a non-metallic filler, or the like.

For example, at least one of the carbon-based filler, the metallic filler, and the non-metallic filler used for preparing the thermally conductive adhesive film may be used as the thermally conductive filler. In this case, the thermally conductive filler may be prepared in the same manner as in the preparation of the carbon-based filler, the metallic filler, and the non-metallic filler as described above.

More specifically, a composite filler used in the thermally conductive adhesive film above may be used as the thermally conductive filler.

The thermally conductive filler in the form of a solid powder may be subjected to classification for selecting particles having a desired particle diameter before the coating step. For example, the filler may be classified into particles of a desired size with a mesh having a size of, for example, 300 or more, or 500 or more. More specifically, it is preferable to use a mesh having a size of 300 to 10,000. For example, the classification of particles may be conducted 3 to 10 times with a mesh having a size of 500 to 2,000.

A grating mesh may be used as the shape of the mesh. For specific shapes of the mesh, (i) a grating mesh having rectangular holes (see FIG. 3a), (ii) a grating mesh having square holes and rectangle holes together (see FIG. 3b), or (iii) a grating mesh having square holes (see FIG. 3c) may be used.

The classification of the thermally conductive filler particles according to the present invention may be carried out with one of these meshes or a combination thereof.

According to an example, the classification of the thermally conductive filler particles may sequentially comprise: (3a) first screening with the grating mesh having rectangular holes; (3b) second screening with the grating mesh having rectangular holes and square holes together; and (3c) third screening with the grating mesh having square holes. At this time, the rectangular holes may be 15 to 30 µm in length and 5 to 10 µm in width. In addition, the square holes may be 5 to 10 µm in length and width. As a result, the particle diameter of the thermally conductive filler upon the first screening may be 0.5 to 30 µm, and the particle diameter of the filler upon the third screening may be 0.5 to 5 µm.

Alternatively, it is possible to use a mesh in the shape of a circle, a triangle, a rhombus, a parallelogram, or a combination thereof. It is also possible to use a mesh in the shape of the thermally conductive filler (spherical, platelet, a mixed type, or the like).

As the material of the mesh, steel, stainless steel (SUS), glass fiber reinforced plastic (FRP), or a combination thereof may be used. Especially, among these, an FRP material prepared by mixing an unsaturated polyester resin and fiberglass is preferable from the viewpoint of light weight, hardness, durability, and economic efficiency.

The thermally conductive filler in the form of a solid powder thus classified is then coated onto both sides of the thermally conductive adhesive film to form thermally conductive filler layers.

At this time, since the thermally conductive adhesive film has adhesiveness on its surface, the thermally conductive filler in the form of a solid powder can be readily coated onto the surface of the thermally conductive adhesive film to form thermally conductive filler layers, even without mixing the thermally conductive filler with an adhesive, a binder, or a solvent for the coating. In addition, since the thermally conductive filler itself has a coagulating force due to electrostatic attraction between the filler particles, the thermally conductive filler can form a uniform layer without an adhesive or a binder resin.

Preferably, the coating of the thermally conductive filler may be carried out more smoothly, if an electric current is applied to the thermally conductive adhesive film during the coating. For example, when an electric current is applied to the thermally conductive adhesive film, the thermally conductive adhesive film is electrically charged by the thermally conductive filler dispersed therein, so that the thermally conductive filler can be more effectively coated onto the surface of the thermally conductive adhesive film. The application of an electric current may be performed at a current density of 1 to 20 $A/dm^2$, more specifically at a current density of 1 to 10 $A/dm^2$.

(4) Rolling Step (Densification of a Filler)

In step (4) above, the sheet produced in the previous step is rolled to press and bond the solid particles of the thermally conductive filler with each other.

Here, the thermally conductive filler coated on the surface of the thermally conductive adhesive film and merely adhered thereto before rolling is pressed through the rolling, so that the bonding force between the thermally conductive filler particles is increased, thereby forming a uniform thin film layer.

The rolling may be performed by, for example, passing through a press roller 1 to 5 times for pressing. The pressing condition and the number of repetition of the rolling may be determined in view of the desired sheet thickness.

The rolling may make the entire sheet thinner, further improve the adhesive force between the thermally conductive adhesive film and the thermally conductive filler layers, and densify the filler. Further, the rolling may compromise the properties (tensile strength and thermal conductivity) of the thermally conductive adhesive film and the properties (high thermal conductivity) of the thermally conductive filler layers, thereby providing a thermally conductive thin sheet having more improved performance.

Articles and a Method of Dissipating Heat

Another embodiment of the present invention provides an article comprising the thermally conductive thin sheet.

Still another embodiment of the present invention provides a method of dissipating heat from an article by using the thermally conductive thin sheet.

The article to which the present invention is applied may be an electronic device, a case for an electronic device, a lighting device, a battery, or a battery case, but is not particularly limited thereto.

The electronic device may be a cellular phone, a desktop PC, a laptop PC, a tablet PC, a virtual reality (VR) device, a set-top box, a handheld game console, an external hard disk drive, an MP3 player, a beam projector, a television, a monitor, a car black box, a car navigator, a communication device, a power converter, a power supplier, or a medical electronic device.

Further, the lighting device may be an LED lighting device or a light bulb.

Preferably, the article may have a heat source that generates heat by an electrical, electronic, or chemical action. For example, the electronic device may comprise an electronic element, a circuit board, or a light source.

The thermally conductive thin sheet may be attached directly to the surface of the heat source, to the surface of a heat sink closely contacted to the heat source, or to a casing of the article adjacent to the heat source.

As a preferred example, the article is an electronic device, a lighting device, or a battery comprising a heat source, and the thermally conductive thin sheet may be attached directly to the surface of the heat source, to the surface of a heat sink closely contacted to the heat source, or to a casing of the article adjacent to the heat source.

FIGS. 6 to 12 show examples in which the thermally conductive thin sheet is employed in various articles. Specifically, FIG. 6 illustrates an exploded view of a cellular phone to which the thermally conductive thin sheet is applied; FIGS. 7a to 7c illustrate cross-sectional views of an electronic device to which the thermally conductive thin sheet is applied; FIGS. 8a and 8b illustrate plan views of direct-type and edge-type flat panel lighting devices to which the thermally conductive thin sheet is applied, respectively; FIGS. 9a and 9b illustrate cross-sectional views of direct-type and edge-type flat panel lighting devices to which the thermally conductive thin sheet is applied, respectively; FIG. 10 illustrates a bulb-type lamp to which the thermally conductive thin sheet is applied; FIG. 11 illustrates a cross-sectional view of an LED lighting device to which the thermally conductive thin sheet is applied; and FIG. 12 illustrates a perspective view of an electric vehicle to which the thermally conductive thin sheet is applied and an enlarged view of the battery cell mounted therein.

As depicted in FIG. 6, the thermally conductive thin sheet (1) may be disposed adjacent to a display unit (113) or a chipset substrate (115) of a cellular phone.

Further, as depicted in FIGS. 7a to 7c, the thermally conductive thin sheet (1) may be attached to a casing (13) in the area corresponding to a heat source (11) of an electronic device (see FIG. 7a), to the surface of a heat sink (12) closely contacted to the heat source (11) (see FIG. 7b), or directly to the surface of the heat source (11) (see FIG. 7c).

Further, as depicted in FIGS. 8a and 9a, the thermally conductive thin sheet (1) may be attached to the rear surface of an LED element (20) of a direct-type flat panel lighting device, or to the rear surface of a heat sink (12) in close contact with the LED element. As depicted in FIGS. 8b and 9b, the thermally conductive thin sheet (1) may be attached to a position adjacent to the edge of an edge-type flat panel lighting device where an LED element (20) is provided, that is, the side of the casing.

Further, as depicted in FIG. 10, the thermally conductive thin sheet may be attached to the inner wall of a casing (13) of a bulb type lamp.

Further, FIG. 11 illustrates a cross-sectional view of a typical LED lighting device. The thermally conductive thin sheet (1) may be attached to one surface of a substrate (50) provided with an LED element (20) and to one surface of a heat sink (12).

In addition, the thermally conductive thin sheet (1) may be attached to the surface of a battery cell (60) mounted in an electric vehicle, as depicted in FIG. 12, in order to protect the battery cell from high temperatures.

FIGS. 13a to 15d illustrate examples in more detail in which the thermally conductive thin sheet is applied to various articles.

As depicted in FIG. 13a, the thermally conductive thin sheet (1) may be attached to the front side (F) or the rear side (B) of a battery (111), which is one of the components that generate heat the most in a cellular phone (110); or to the front side (F) or the rear side (B) of a battery cover (112) of the cellular phone (110), for the purpose of dissipating heat.

In addition, as depicted in FIG. 13b, the thermally conductive thin sheet (1) may be attached to a cellular phone case in addition to the cellular phone body to dissipate heat from the cellular phone. For example, the thermally conductive thin sheet (1) may be attached to the front side (F) or the rear side (B) of an open-type cellular phone case (120); to the front side (F) or the rear side (B) of a cover unit (131) of a folder-type cellular phone case (130); or to the front side (F) or the rear side (B) of a housing unit (132) for accommodating a cellular phone (110) in the folder-type cellular phone case (130), in order to dissipate heat.

The open-type cellular phone case (120) and the folder-type cellular phone case (130) may comprise a material selected from the group consisting of a polymer resin, natural leather, synthetic leather, metal, rubber, cubic zirconia, and a combination thereof.

Further, the thermally conductive thin sheet (1) may be applied to a mobile device other than a cellular phone. For example, it may be attached to the rear side (B) of a tablet PC (200) (see FIG. 14a); to the rear side (B) of a display unit (301) of a laptop PC (300) or the front or rear side of a keyboard unit (302) (see FIG. 14b); to the rear side (B) of a handheld game console (400) (see FIG. 14c); or to the rear side (B) of an MP3 player (500) (see FIG. 14d), in order to dissipate heat.

Further, the thermally conductive thin sheet (1) may be applied to other various electronic devices than those exemplified above and may be attached to the front side (F) or the rear side (B) of an external hard disk drive (600) (see FIG. 15a); to the top side (U), the bottom side (L), or the side (S) of a set-top box (700) (see FIG. 15b); to the top side (U) or the bottom side (L) of a beam projector (800) (see FIG. 15c); or to the front side (F) or the rear side (B) of a car black box (900) (see FIG. 15d), in order to dissipate heat.

The articles according to the present invention comprise the thermally conductive thin sheet, thereby effectively dissipating heat generated during use of the articles. Especially, the thermally conductive thin sheet applied to the articles of the present invention has thermally conductive filler layers formed on both sides of a thermally conductive adhesive film having a composite filler. Thus, it has a high filler filling rate and is excellent in tensile strength and flexibility, to thereby renders it convenient to handle. Therefore, the thermally conductive thin sheet may be employed in various articles such as an electronic device and a lighting device in which a light emitting source such as an LED or an OLED is adopted or IC chips are highly integrated, to thereby effectively dissipate heat generated during the use thereof.

MODE FOR THE INVENTION

Hereinafter, examples of preparing a thermally conductive thin sheet and applying the same to an article will be described in more detail.

Example 1: Preparation of a Thermally Conductive Thin Sheet

Step (1): Preparation of a Thermally Conductive Composition (1a) Preparation of a First Dispersion Solution A flaky graphite powder having a particle diameter of 5 to 10 μm was mixed with carbon black having a particle diameter of 1 to 20 μm to prepare a carbon-based filler. Here, the content of carbon black in the carbon-based filler was 5 wt %. An organic solvent and a dispersant were added to the carbon-based filler obtained above to prepare a first dispersion solution. A mixture of propylene glycol methyl ether acetate (PGMEA: CAS No. 108-65-6), cyclohexanone (CAS No. 108-94-1), an aromatic hydrocarbon solvent (CAS No. 64742-95-6), and 3,5,5-trimethyl-2-cyclohexen-1-one (isophorone: CAS No. 78-59-1) in a weight ratio of 2:3:3:3 was used as the organic solvent. Disperbyk-160 having a pH of 6.5 was used as the dispersant. The carbon-based filler, the organic solvent mixture, and the dispersant were placed in a stirrer in a weight ratio of 20:80:5, and the number of revolutions of the stirrer was gradually increased to disperse them. The number of revolutions was raised up to 40 rpm under vacuum, and the mixture was stirred for 2 hours to prepare the first dispersion solution.

(1b) Preparation of a Second Dispersion Solution

A metallic filler and a non-metallic filler were added to the first dispersion solution prepared in step (1a) above to prepare a second dispersion solution. A copper powder (Ronald Britton Ltd) having a dendritic structure and a particle diameter of 1 to 5 μm was used as the metallic filler. Further, an alumina powder having a particle diameter of 2 to 5 μm was used as the non-metallic filler. The metallic filler and the non-metallic filler were added to the first dispersion solution in an amount of 20 parts by weight, respectively, per 10 parts by weight of the carbon-based filler contained in the first dispersion solution. Specifically, after the vacuum applied to the stirrer containing the first dispersion solution was released, the metallic filler and the non-metallic filler were added, and the mixture was further stirred at 30 rpm for 15 minutes. Then, the impeller of the stirrer was rotated in the reverse direction at 10 rpm for 20 minutes for defoamation to thereby obtain the second dispersion solution.

(1c) Preparation of a Thermally Conductive Composition

A binder resin was added to the second dispersion solution prepared in step (1b) above to obtain a final thermally conductive composition. A two-component thermosetting urethane resin (NFH100, NCC Trade Co., Ltd.) was used as the binder resin. The binder resin was added in an amount of about 55 wt % based on 100 wt % of the final composition. Specifically, the binder resin was added to a stirrer containing the second dispersion solution obtained in step (1c) above, and the number of revolutions of the stirrer was gradually increased to disperse them. At first, the number of revolutions was raised up to 25 rpm under vacuum, the mixture was stirred for 1 hour, and the vacuum was released. Then, the impeller of the stirrer was rotated in the reverse direction at 5 rpm for 10 minutes for defoamation. The composition thus obtained was subjected to ultrasonic vibration treatment for about 20 minutes to thereby finally obtain the thermally conductive composition.

Step (2): Preparation of a Thermally Conductive Adhesive Film (2a) Preparation of an Adhesive Composition An adhesive was blended with the thermally conductive composition obtained in step (1) above to prepare an adhesive composition. Specifically, the adhesive and the thermally conductive composition were blended at 20 to 50° C. for 2 to 4 hours. Here, n-butyl acrylate, 2-ethylhexyl methacrylate, and ethylene were diluted in xylene and cyclohexanone for use as the adhesive. The weight ratio of n-butyl acrylate, 2-ethylhexyl methacrylate, ethylene, xylene, and cyclohexanone was 20:20:10:10:5.

(2b) Preparation of a Thermally Conductive Adhesive Film

The adhesive composition obtained in step (2a) above was coated onto both sides of a polymer resin layer (a polyester film). The coated layers were dried to prepare a thermally conductive adhesive film having thermally conductive adhesive layers formed on the top and bottom sides of the polymer resin layer. The surface of the thermally conductive adhesive film thus prepared was observed with an electron microscope and is shown in FIG. 2a.

Step (3): Formation of a Thermally Conductive Filler Layer

An expanded graphite powder, a copper powder, and an alumina powder were mixed in a weight ratio of 60:20:20 to obtain a mixture of thermally conductive filler powders.

The mixture of thermally conductive filler powders was classified through a grating mesh of an FRP material. Here, the mixture was subjected to first screening with a mesh having rectangular (19×6 μm) holes, second screening with a mesh having rectangular (19×6 μm) holes and square (6×6 μm) holes together, and third screening with a mesh having square (6×6 μm) holes. As a result, the mixture of thermally conductive filler powders finally classified had a particle diameter of 0.5 to 5 μm.

The powder thus classified was coated onto both sides of the thermally conductive adhesive film prepared in step (2) above. At this time, the coating was performed while an electric current was applied to the thermally conductive adhesive film at a current density of 6 to 10 A/dm$^2$ for 5 to 10 seconds.

As a result, a sheet having thermally conductive filler layers formed on both sides of the thermally conductive adhesive film was obtained. FIG. 2b is an electron micrograph photograph observing the surface of the thermally conductive filler layer prepared in step (3).

Step (4): Rolling

The sheet having the thermally conductive filler layers as formed in the previous step was rolled through a roller 1 to 5 times to obtain a thermally conductive thin sheet.

The total thickness of the thermally conductive thin sheet finally obtained was about 30 μm, in which the thickness of the thermally conductive adhesive film was about 5 μm, and the thickness of the thermally conductive filler layers was about 25 μm.

Example 2: Articles Provided with a Thermally Conductive Thin Sheet

The thermally conductive thin sheet obtained in Example 1 was applied to a cellular phone. Specifically, the thermally conductive thin sheet was attached to the heat source (LCD panel) of the cellular phone after the main body (Galaxy Note III, Samsung Electronics) was dismounted. Then, heat generated from the heat source was dissipated during the use of the cellular phone.

Test Example 1: Measurement of Thermal Diffusivity

The thermal diffusivity of the thermally conductive thin sheet prepared in Example 1 was compared with that of a copper foil sheet under various conditions.

(1) Heat Dissipation Materials

Copper foil sheet: a commercially available copper sheet (STN2050C, Solueta) was used.

Thermally conductive thin sheet: the thermally conductive thin sheet according to Example 1 was used.

Ordinary double-sided tape: a commercially available double-sided tape (CT-010, Chemco Co., Ltd.) was used.

Thermally conductive double-sided tape: a commercially available, thermally conductive double-sided tape (INP-TDT10, Innopole Co., Ltd.) was used.

(2) Samples (the Number in the Parentheses Standing for Thickness)

Sample A1: thermally conductive thin sheet (30 μm)

Sample A2: a laminated sheet of thermally conductive thin sheet (40 μm)/thermally conductive double-sided tape (10 μm)

Sample A3: a laminated sheet of ordinary double-sided tape (10 μm)/thermally conductive thin sheet (50 μm)/ordinary double-sided tape (10 μm)

Sample B1: copper foil sheet (16 μm)

Sample B2: a laminate sheet of copper foil sheet (20 μm)/thermally conductive double-sided tape (10 μm)

Sample B3: a laminated sheet of ordinary double-sided tape (10 μm)/copper foil sheet (50 μm)/ordinary double-sided tape (10 μm)

(3) Test Procedure

The thermal diffusivity of the samples prepared above was measured using LFA447 Nanoflash from NETZSCH, Germany, according to the laser flash analysis (LFA) method under ASTM E 1416.

(4) Test Results and Evaluation

The thermal diffusivity measured for the samples in the horizontal direction (plane direction) is summarized in Table 1 below.

TABLE 1

| Sample | Thermal diffusivity ($mm^2/s$) | Sample | Thermal diffusivity ($mm^2/s$) |
|---|---|---|---|
| Sample A1 | 145.080 | Sample B1 | 77.225 |
| Sample A2 | 105.837 | Sample B2 | 55.911 |
| Sample A3 | 90.72 | Sample B3 | 50.618 |

As shown in Table 1 above, the samples using the thermally conductive thin sheet according to Example 1 (Samples A1 to A3) showed remarkably higher thermal diffusivities than those of the samples using the copper foil sheet (Samples B1 to B3) in the same laminate configuration.

Test Example 2: Measurement of Tensile Strength

The tensile strength of the thermally conductive thin sheet having a thickness of 30 μm as prepared by steps (1) to (4) in Example 1 was measured, and the tensile strength of a natural graphite sheet having a thickness of 30 μm was also measured. The results are shown in Table 2 below. The tensile strength was obtained as an average value of two measurements.

TABLE 2

| | Tensile strength ($kg/mm^2$) | | |
|---|---|---|---|
| | First measurement | Second measurement | Average |
| Thermally conductive thin sheet | 28 | 33 | 31 |
| Natural graphite sheet | 0.15 | 0.45 | 0.30 |

As shown in Table 2 above, the thermally conductive thin sheet according to Example 1 had a tensile strength of about 10 times higher than that of the natural graphite sheet.

Test Example 3: Evaluation of Heat Dissipation from a Cellular Phone

The thermally conductive thin sheet prepared in Example 1 was applied to a cellular phone to evaluate its heat dissipation performance under various conditions.

(1) Heat Dissipation Materials

Copper foil sheet: a commercially available copper sheet (STN2050C, Solueta) was used.

Thermally conductive thin sheet: the thermally conductive thin sheet according to Example 1 was used.

Ordinary double-sided tape: a commercially available double-sided tape (CT-010, Chemco Co., Ltd.) was used.

Thermally conductive double-sided tape: a commercially available, thermally conductive double-sided tape (INP-TDT10, Innopole Co., Ltd.) was used.

(2) Samples (the Number in the Parentheses Standing for Thickness)

Sample C1: a laminated sheet of thermally conductive thin sheet (30 μm)/ordinary double-sided tape (10 m)

Sample C2: a laminated sheet of thermally conductive thin sheet (30 m)/thermally conductive double-sided tape (10 μm)

Sample D1: a laminate sheet of copper foil sheet (30 m)/ordinary double-sided tape (10 μm)

Sample D2: a laminated sheet of copper foil sheet (30 m)/thermally conductive double-sided tape (10 μm)

(3) Test Procedure

The samples each were attached to the heat source (LCD panel) of a cellular phone (Galaxy Note III, Samsung Electronics) after the main body was dismounted. All functions of the cellular phone were terminated (initial temperature: 24±0.5° C.). After the video recording function of the cellular phone was operated to raise the temperature for 15 minutes, the video recording function was stopped, and the temperature was lowered for 15 minutes. Temperature was measured every 5 minutes at two measurement points fixed to the heat source with an infrared camera (TH9100PWV, NEC).

(4) Test Results and Evaluation

The temperature at each point for each measured sample is summarized in Tables 3 to 6 below. Further, FIGS. 4*a* to 5*b* show measurement results in a graph.

TABLE 3

Temperature measured at Point 1 with respect to time elapsed (° C.)

| Sample | 0 min | 5 min | 10 min | 15 min | 18 min | 21 min | 24 min |
|---|---|---|---|---|---|---|---|
| Sample C1 | 25 | 28.2 | 30.2 | 34.1 | 26.8 | 26 | 26.2 |
| Sample D1 | 25 | 35.2 | 38 | 37.8 | 33.6 | 30.3 | 29.3 |

TABLE 4

Temperature measured at Point 2 with respect to time elapsed (° C.)

| Sample | 0 min | 5 min | 10 min | 15 min | 18 min | 21 min | 24 min |
|---|---|---|---|---|---|---|---|
| Sample C1 | 25 | 27.5 | 28.8 | 29.2 | 26.8 | 26.3 | 26.1 |
| Sample D1 | 25 | 29.6 | 30.6 | 30.9 | 32.6 | 29.4 | 27.5 |

TABLE 5

Temperature measured at Point 1 with respect to time elapsed (° C.)

| Sample | 0 min | 5 min | 10 min | 15 min | 18 min | 21 min | 24 min |
|---|---|---|---|---|---|---|---|
| Sample C2 | 26.0 | 27.5 | 28.8 | 29.2 | 26.8 | 26.3 | 26.1 |
| Sample D2 | 26.0 | 29.6 | 30.6 | 30.9 | 32.6 | 29.4 | 27.5 |

TABLE 6

Temperature measured at Point 2 with respect to time elapsed (° C.)

| Sample | 0 min | 5 min | 10 min | 15 min | 18 min | 21 min | 24 min |
|---|---|---|---|---|---|---|---|
| Sample C2 | 26.0 | 28.8 | 29.2 | 29.5 | 27.5 | 26.9 | 26.2 |
| Sample D2 | 26.0 | 30 | 30.9 | 31.3 | 27.9 | 27.1 | 26.7 |

As shown in Tables 3 to 6 above and FIGS. 4a to 5b, the samples using the thermally conductive thin sheet according to Example 1 (Samples C1 and C2) showed lower temperatures than those of the samples using the copper foil sheet (Samples D1 and D2) at each point of the heat source of the cellular phone.

Especially, the sample that employed the thermally conductive double-sided tape attached to one side of the thermally conductive thin sheet (Sample C2) showed lower temperatures than those of the sample that employed the ordinary double-sided tape attached to one side of the thermally conductive thin sheet (Sample C1) at each point of the heat source of the cellular phone.

The invention claimed is:

1. A thermally conductive thin sheet, which comprises:
(A) a thermally conductive adhesive film comprising (a) a composite filler comprising a carbon-based filler and a metallic filler, (b) a binder resin, and (c) an adhesive; and
(B) thermally conductive filler layers formed on both sides of the thermally conductive adhesive film, wherein the thermally conductive filler layers are formed by pressing at least one thermally conductive filler in the form of a solid powder without an adhesive or a binder resin; the thermally conductive thin sheet has a tensile strength of 20 to 50 kg/mm$^2$ and a filler filling rate of 40 to 90 wt %; and the filler filling rate is the ratio represented in percent of the sum of weights of the composite filler and the thermally conductive filler contained in the thermally conductive thin sheet to the total weight of the thermally conductive thin sheet.

2. The thermally conductive thin sheet according to claim 1, which has a total thickness of 20 to 1,000 μm, a filler filling rate of 50 to 90 wt %, and a tensile strength of 25 to 50 kg/mm$^2$.

3. The thermally conductive thin sheet according to claim 1, which has a total thickness of 25 to 500 μm, a filler filling rate of 60 to 90 wt %, and a tensile strength of 30 to 50 kg/mm$^2$.

4. The thermally conductive thin sheet according to claim 1, wherein the metallic filler is a metallic particle that has a dendrite structure and contains at least one metal component, and the carbon-based filler is a kish graphite powder.

5. A process for manufacturing the thermally conductive thin sheet of claim 1, which comprises:
(1) preparing a thermally conductive composition comprising (a) a composite filler comprising a carbon-based filler and a metallic filler and (b) a binder resin;
(2) blending an adhesive with the thermally conductive composition, molding the thermally conductive composition in a sheet form, and drying the molded sheet to obtain a thermally conductive adhesive film;
(3) forming thermally conductive filler layers on both sides of the thermally conductive adhesive film by coating at least one thermally conductive filler in the form of a solid powder without an adhesive or a binder resin to form a sheet; and
(4) rolling the obtained sheet to press the solid particles of the thermally conductive filler to bond each other.

6. The process for manufacturing the thermally conductive thin sheet according to claim 5, wherein the preparing the thermally conductive composition in step (1) comprises:
(1a) preparing a carbon-based filler;
(1b) adding the carbon-based filler to a solvent mixture of an acetate solvent, an aromatic hydrocarbon solvent, and an alicyclic ketone solvent and stirring them to obtain a first dispersion solution;
(1c) adding a metallic filler to the first dispersion solution and stirring them to obtain a second dispersion solution; and
(1d) adding a binder resin to the second dispersion solution and stirring them to obtain a liquid composition.

7. The process for manufacturing the thermally conductive thin sheet according to claim 6, wherein the metallic filler is used in an amount of 20 to 400 parts by weight per 100 parts by weight of the carbon-based filler, the solvent mixture is used in an amount of 300 to 500 parts by weight per 100 parts by weight of the sum of the carbon-based filler and the metallic filler, and the binder resin is used in an amount of 25 to 500 parts by weight per 100 parts by weight of the composite filler, wherein the solvent mixture is a mixture of an acetate solvent, an aromatic hydrocarbon solvent, and an alicyclic ketone solvent in a weight ratio of 1:1-2:3-7.

8. The process for manufacturing the thermally conductive thin sheet according to claim 6, wherein the thermally conductive composition has a dispersion distribution with a zeta potential ranging from 20 to 100 mV at a pH of 5 to 8.

9. The process for manufacturing the thermally conductive thin sheet according to claim 5, wherein the thermally conductive filler in step (3) is classified by sequentially conducting:
   (3a) first screening with a grating mesh having rectangular holes;
   (3b) second screening with a grating mesh having rectangular holes and square holes together; and
   (3c) third screening with a grating mesh having square holes,
   wherein the rectangular holes are 15 to 30 μm in length and 5 to 10 μm in width, and the square holes are 5 to 10 μm in length and width.

10. The process for manufacturing the thermally conductive thin sheet according to claim 5, wherein the coating of the thermally conductive filler is carried out while an electric current is applied to the thermally conductive adhesive film.

11. An article comprising the thermally conductive thin sheet of claim 1.

12. The article according to claim 11, which is an electronic device, a case for an electronic device, a lighting device, a battery, or a battery case.

13. The article according to claim 12, wherein the electronic device is a cellular phone, a desktop PC, a laptop PC, a tablet PC, a virtual reality (VR) device, a set-top box, a handheld game console, an external hard disk drive, an MP3 player, a beam projector, a television, a monitor, a car black box, a car navigator, a communication device, a power converter, a power supplier, or a medical electronic device; and the lighting device is an LED lighting device or a light bulb.

14. A method of dissipating heat from an article by using the thermally conductive thin sheet of claim 1.

15. The method of dissipating heat from an article according to claim 14, wherein the article is an electronic device, a lighting device, or a battery comprising a heat source; and the thermally conductive thin sheet is attached directly to the surface of the heat source, to the surface of a heat sink closely contacted to the heat source, or to a casing of the article adjacent to the heat source.

* * * * *